United States Patent
Den et al.

(10) Patent No.: US 7,087,831 B2
(45) Date of Patent: Aug. 8, 2006

(54) PHOTOELECTRIC CONVERSION DEVICE AND METHOD OF PRODUCTION THEREOF

(75) Inventors: Tohru Den, Tokyo (JP); Hiroshi Okura, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 7 days.

(21) Appl. No.: 10/663,752

(22) Filed: Sep. 17, 2003

(65) Prior Publication Data

US 2004/0060591 A1 Apr. 1, 2004

Related U.S. Application Data

(62) Division of application No. 09/665,983, filed on Sep. 20, 2000, now Pat. No. 6,649,824.

(30) Foreign Application Priority Data

Sep. 22, 1999 (JP) ............... 11-268725
Jun. 16, 2000 (JP) ............... 2000-181747

(51) Int. Cl.
H01L 31/0352 (2006.01)
H01L 31/0264 (2006.01)
H01L 31/036 (2006.01)

(52) U.S. Cl. ............ 136/250; 136/256; 136/263; 136/258; 136/252; 136/249; 257/431; 257/436; 257/461; 257/43; 429/111

(58) Field of Classification Search .......... 136/256, 136/263, 258, 252, 250, 249; 257/431, 436, 257/461, 43; 429/111
See application file for complete search history.

(56) References Cited

U.S. PATENT DOCUMENTS

| 3,783,325 A | 1/1974 | Shelton |
| 3,925,212 A * | 12/1975 | Tchernev .................. 422/186 |
| 3,961,997 A * | 6/1976 | Chu ........................... 438/97 |
| 4,155,781 A | 5/1979 | Diepers |
| 4,163,918 A | 8/1979 | Shelton |
| 4,190,950 A * | 3/1980 | Skotheim .................. 438/69 |
| 4,278,830 A * | 7/1981 | Frosch et al. ............. 136/255 |

(Continued)

FOREIGN PATENT DOCUMENTS

DE    19602595    7/1997

(Continued)

OTHER PUBLICATIONS

M.K. Nazeeruddin, et al., "Conversion of Light to Electricity by cis-$X_2$Bis(2,2'-bipyridyl-4,4'-dicarboxylate)ruthenium(II) Charge-Transfer Sensitizers ($X\uparrow Cl^-$; $Br^-$; $I^-$; $CN^-$; and $SCN^-$) on Nanocrystalline $TiO_2$ Electrodes," J. Am. Chem. Soc., vol. 115, No. 14, pp. 6382-6390 (1993), month unknown.

(Continued)

*Primary Examiner*—Alan Diamond
(74) *Attorney, Agent, or Firm*—Fitzpatrick, Cella, Harper & Scinto

(57) ABSTRACT

A photoelectric conversion device comprising at least an electron acceptive charge transfer layer, an electron donative charge transfer layer, and a light absorption layer existing between the charge transfer layers, wherein either one of the charge transfer layers comprises a semiconductor acicular crystal layer comprising an aggregate of acicular crystals or a mixture of an acicular crystal and another crystal, and a method of producing the device are disclosed. Consequently, a photoelectric conversion device being capable of smoothly carrying out transfer of electrons and having high photoelectric conversion efficiency is provided.

8 Claims, 14 Drawing Sheets

U.S. PATENT DOCUMENTS

| | | | |
|---|---|---|---|
| 4,345,181 A | 8/1982 | Shelton | |
| 4,379,250 A | 4/1983 | Hosoki et al. | |
| 4,433,202 A * | 2/1984 | Maruyama et al. | 136/255 |
| 4,490,573 A * | 12/1984 | Gibbons | 136/255 |
| 4,492,736 A * | 1/1985 | Tanner | 428/446 |
| 4,927,721 A | 5/1990 | Gratzel et al. | |
| 5,066,475 A | 11/1991 | Yoshinaka et al. | |
| 5,084,365 A | 1/1992 | Gratzel et al. | |
| 5,164,632 A | 11/1992 | Yoshida et al. | |
| 5,171,480 A | 12/1992 | Yoshinaka et al. | |
| 5,279,809 A | 1/1994 | Kitano et al. | |
| 5,346,785 A * | 9/1994 | Akuto et al. | 429/111 |
| 5,350,644 A | 9/1994 | Graetzel et al. | |
| 5,362,514 A | 11/1994 | Flatz et al. | |
| 5,441,827 A | 8/1995 | Gratzel et al. | |
| 5,454,880 A | 10/1995 | Sariftci et al. | |
| 5,482,570 A * | 1/1996 | Saurer et al. | 136/255 |
| 5,571,612 A * | 11/1996 | Motohiro et al. | 428/323 |
| 5,581,091 A | 12/1996 | Moskovits et al. | |
| 5,825,122 A | 10/1998 | Givargizov et al. | |
| 5,872,422 A | 2/1999 | Xu et al. | |
| 5,885,368 A | 3/1999 | Lupo et al. | |
| 5,967,873 A | 10/1999 | Rabinowitz | |
| 5,986,206 A | 11/1999 | Kambe et al. | |
| 6,043,428 A | 3/2000 | Han et al. | |
| 6,113,451 A | 9/2000 | Hobart et al. | |
| 6,133,061 A | 10/2000 | Sonoda | |
| 6,150,605 A * | 11/2000 | Han | 136/263 |
| 6,217,843 B1 | 4/2001 | Homyonfer et al. | |
| 6,228,502 B1 | 5/2001 | Saitoh et al. | |
| 6,239,355 B1 * | 5/2001 | Salafsky | 136/250 |
| 6,270,571 B1 | 8/2001 | Iwasaki et al. | |
| 6,281,430 B1 * | 8/2001 | Lupo et al. | 136/263 |
| 6,300,559 B1 * | 10/2001 | Ohmori | 136/263 |
| 6,310,282 B1 * | 10/2001 | Sakurai et al. | 136/263 |
| 6,525,461 B1 | 2/2003 | Iwasaki et al. | |
| 6,534,334 B1 * | 3/2003 | Sasaki | 438/57 |
| 6,596,078 B1 | 7/2003 | Konakahara et al. | |
| 6,608,326 B1 * | 8/2003 | Shinagawa et al. | 257/64 |
| 6,649,824 B1 * | 11/2003 | Den et al. | 136/256 |
| 6,683,244 B1 * | 1/2004 | Fujimori et al. | 136/263 |
| 6,720,202 B1 * | 4/2004 | Wang | 438/85 |
| 6,849,797 B1 * | 2/2005 | Koyanagi et al. | 136/256 |
| 6,849,798 B1 * | 2/2005 | Mitra et al. | 136/265 |
| 6,852,920 B1 * | 2/2005 | Sager et al. | 136/263 |
| 2002/0037249 A1 | 3/2002 | Konakahara et al. | |
| 2002/0121851 A1 | 9/2002 | Yasui et al. | |
| 2002/0139688 A1 | 10/2002 | Okura et al. | |
| 2002/0192441 A1 * | 12/2002 | Kalkan et al. | 428/209 |
| 2003/0102024 A1 * | 6/2003 | Zeira | 136/263 |
| 2004/0003838 A1 * | 1/2004 | Curtin | 136/250 |
| 2004/0084080 A1 * | 5/2004 | Sager et al. | 136/263 |
| 2004/0118448 A1 * | 6/2004 | Scher et al. | 136/252 |
| 2004/0157354 A1 * | 8/2004 | Kuriyama et al. | 438/45 |
| 2004/0221888 A1 * | 11/2004 | Fukui et al. | 136/263 |

FOREIGN PATENT DOCUMENTS

| | | |
|---|---|---|
| EP | 0351110 | 1/1990 |
| EP | 0364597 | 4/1990 |
| EP | 0364964 | 4/1990 |
| EP | 901175 A2 | 3/1999 |
| EP | 913850 A1 | 5/1999 |
| EP | 1087446 A2 | 3/2001 |
| JP | 50-6597 | 1/1975 |
| JP | 56-120518 | 9/1981 |
| JP | 57-160174 | 10/1982 |
| JP | 60-5529 | 2/1985 |
| JP | 1-252600 | 10/1989 |
| JP | 6-89651 | 3/1994 |
| JP | 6-163957 A * | 6/1994 |
| JP | 8-213644 A * | 8/1996 |
| JP | 8-239300 | 9/1996 |
| JP | 9-237641 | 9/1997 |
| JP | 10-112337 | 4/1998 |
| JP | 10-316428 | 12/1998 |
| JP | 2000-203998 A | 7/2000 |
| WO | WO 91/16719 A2 | 10/1991 |
| WO | WO 95/07543 | 3/1995 |
| WO | WO 97/07607 | 7/1997 |
| WO | WO 98/39250 | 9/1998 |
| WO | WO 98/48456 | 10/1998 |

OTHER PUBLICATIONS

H. Tsubomura, et al., "Dy sensitised zinc oxide:aqueous electrolyte:platinum photocell", Nature, vol. 261, pp. 402-403 (1976), month unknown.

Christian Coddet et al., "Metallography: Growth of Crichites During Oxidation of Titanium or of the Alloy TA6V4 By Steam at High Temperature," C.R. Acad. Sc. Paris, t. 281, Series C, pp. 507-510 (Sep. 29, 1975).

Routkevitc et al., "Nonlithiographic Nano-Wire Arrays: Fabrication, Physics, and Devic Applications," IEEE Trans. Elec. Dev. 43, No. 10, Oct. 1996, pp. 1646-1658.

Hoyer, et al., "Electrodeposited nanoporous $TiO_2$ film by a two-step replication process from anodic porous alumina," E. Letters, 15 (1996) 1228-1230, month unknown.

Routkevitch, et al. "Porous Anodic Alumina Templates For Advances Nanofabrication," Electrochem Soc. Proc. 97-7, (1997) 350-357, month unknown.

Masuda, et al., "Crystal Growth, Dielectric and Polarization Reversal Properties of $Bi_4Ti_3O_{12}$ Single Crystal," Jpn. J. Appl. Phys. 31, 9B (1992) 3108-3112, month unknown.

Mawlawi, et al., "Nonowires formed in anodic oxide nanotemplates," J. Mat. Res. 9, 4 (1994) 1014-1018, month unknown.

Harada, et al. "Preparation and Mechanical Properties of AC8A Aluminum Alloy Composite Reinforced with Potassium Titanate Whisker"; J. Jap. Inst. Met. 58, 1 (1994) p. 69-77, month unknown.

Huber, et al., "Nanowire Array Camposites," Sci. 263 (1994) 800-802, month unknown.

Furneaux, et al., "The Formation of controlled-porosity membranes from anodically oxidized aluminum," Nature 337 (1989) 147-149, month unknown.

Masuda, et al., "Preparation of Microporous polymer films by using anodic porous alumina as template," Surface Techniques, 43, 8 (1992) 66-67, month unknown.

Masuda, Solid State Physics, 31, 5 (1996) 493-499, month unknown.

Iwanaga, et al., "A Note on the Orientation of ZnO Ribbon Crystal," Japan J. Appl. Phys., vol. 11, (1972) pp. 121-122, month unknown.

Kitano, et al., "Growth of Large Tetrapod-Like ZnO Crystals," Jpn. J. Crystl. Growth, vol. 102 (1990) 965-973, month unknown.

Satoh, et al., "Epitaxial Growth of Zinc Oxide Whiskers by Chemical-Vapor Deposition Under Atmospheric Pressure," Jpn. J. Appl. Phys. vol. 38 (1999) L 586-L589, month unknown.

Pan, et al., "Nanobelts of Semiconducting Oxides," Science, vol. 291 (Mar. 2001) 1947-1949.

O'Regan, et al., "A low cost, high efficiency solar cell based on dye-sensitized colloidal $TiO_2$ films," Nature, vol. 353, pp. 737-740, Oct. 24, 1991.

* cited by examiner

PRIOR ART

PHOTOELECTRIC CONVERSION DEVICE AND METHOD OF PRODUCTION THEREOF

This is a divisional application of application Ser. No. 09/665,983, filed Sep. 20, 2000, now U.S. Pat. No. 6,649,824.

BACKGROUND OF THE INVENTION

1. Field of the Invention

The prevent invention relates to a photoelectric conversion device and a method of producing the device, and more particularly, to a photoelectric conversion device comprising at least an electron acceptive charge transfer layer, an electron donative charge transfer layer, and a light absorption layer formed between these charge transfer layers and a method of producing the device.

2. Related Background Art

A solar cell utilizing a semiconductor junction of silicon, gallium arsenide or the like is generally known as a method of converting light energy into electric energy. A crystal silicon solar cell and a polycrystalline silicon solar cell utilizing a p-n junction of a semiconductor, and an amorphous silicon solar cell utilizing a p-i-n junction of a semiconductor have been developed for practical application. However, since the production cost of a silicon solar cell is relatively high and much energy is consumed in the production process, it is necessary to use the solar cell for a long duration in order to compensate the production cost and the consumed energy. Especially, the high production cost interferes with the wide use of a silicon solar cell.

On the other hand, recently, solar cells using CdTe and CuIn(Ga)Se have been studied for practical application as second generation thin film solar cells. Regarding the solar cells using these materials, problems with environmental pollution and resource consumption have been observed.

In addition to those dry type solar cells using a semiconductor junction, there is also suggested a wet type solar cell utilizing a photoelectric chemical reaction caused in the interface of a semiconductor and an electrolytic solution. A metal oxide semiconductor such as titanium oxide, tin oxide, or the like used for the wet solar cell has an advantage of lowering solar-cell manufacturing cost as compared with silicon, gallium arsenide, or the like used for the foregoing dry type solar cells. Above all, titanium oxide is expected to be a future energy conversion material since it is excellent in both photoelectric conversion efficiency in an ultraviolet region and stability. Since a stable semiconductor such as titanium oxide, however, has a wide band gap not less than 3 eV, only ultraviolet rays, which are about 4% of sunrays, can be utilized, and the photoelectric conversion efficiency has been insufficient.

For this reason, a photochemical cell (dye-sensitized wet type solar cell) comprising a photoelectric semiconductor adsorbing dye on the surface has been studied. At the beginning, a single crystal electrode of a semiconductor was used for such a photochemical cell. Examples of such electrode are titanium oxide, zinc oxide, cadmium sulfide, tin oxide, or the like. Since an amount of the coloring agent to be adsorbed on the single crystal electrode lowered photoelectric conversion efficiency and the cost was high, a porous semiconductor electrode was then used. Tubomura et al. (NATURE, 261 (1976) p. 402) reported that the photoelectric conversion efficiency had been improved by adsorbing dye in a semiconductor electrode made of a porous zinc oxide produced by sintering a fine particle. Proposals of employing porous semiconductor electrodes were also made in Japanese Patent Application Laid-Open No. 10-112337 and Japanese Patent Application Laid-Open No. 9-237641.

Graetzel et al. (J. Am. Chem. Soc. 115 (1993) 6382, U.S. Pat. No. 5,350,644) also reported that performance as high as that of a silicon solar cell was achieved by improving dye and a semiconductor electrode. There, a ruthenium type coloring agent was used as dye and an anatase type porous titanium oxide ($TiO_2$) was used as a semiconductor electrode.

FIG. 6 is a schematic cross-sectional view of a photochemical cell using the dye-sensitized semiconductor electrode reported by Graetzel et al. (hereafter referred to as a Graetzel type cell). FIG. 6 shows an outline structure and functions of the cell.

In FIG. 6, 14a and 14b denote a glass substrate, 15a and 15b denote a transparent electrode formed on a glass substrate, and 61 denotes an anatase type porous titanium oxide semiconductor layer composed of fine titanium oxide particles bonded to one another in a porous state. Further, 62 denotes a light absorption layer of dye bonded to the surface of the fine titanium oxide particles and 63 denotes an electron donative electrolytic solution. An electrolytic solution containing iodine ions may be employed as the electron donative electrolytic solution.

A method of manufacturing a Graetzel type cell will be described below.

At first, a layer of an anatase type titanium oxide fine particle is formed on a glass substrate 14a on which a transparent electrode 15a is formed. Various kinds of formation methods are available, and generally, formation of an approximately 10 μm thick semiconductor layer 61 of an anatase type titanium oxide fine particle is carried out by applying a paste containing dispersed anatase type titanium oxide fine particles with 10 to 20 μm particle diameter to a transparent electrode 15a and then firing the paste at 350 to 500° C. Such a method can provide a layer with about 50% porosity and about a 1000 roughness factor (practical surface area/apparent surface area), in which the fine particles are well bonded to one another.

After that, dye is adsorbed in the produced titanium oxide layer 61. Various kinds of substances have been studied for use as dye and generally a Ru complex is utilized. The titanium oxide layer 61 is immersed in a solution containing dye and dried to bind the coloring agent to the surfaces of the titanium oxide fine particles and to form a light absorption layer 62. A substance which does not inhibit adsorption of dye in a titanium oxide layer, is capable of dissolving dye well and is electrochemically inert even if remaining on the surface of the electrode (the transparent electrode and the titanium oxide) is suitable as a solvent to dissolve the coloring agent, and from that point, ethanol and acetonitrile are preferably used.

Further, as an opposed electrode, a glass substrate 14b on which a transparent electrode 15b is formed is made ready and an ultra thin film of platinum or graphite is formed on the surface of the transparent electrode 15b. The ultra thin film works as a catalyst at the time of transporting electric charge to and from an electrolytic solution 63.

After that, while the transparent electrode 15a and 15b being set in the inner sides, the glass substrates 14a and 14b are overlaid as to hold the electrolytic solution 63 between them to give a Graetzel type cell. Acetonitrile, propylene carbonate, or the like, which are electrochemically inert and capable of dissolving a sufficient amount of an electrolytic substance, are preferably used as a solvent for the electrolytic solution 63. As an electrolytic substance, a stable redox pair such as $I^-/I_3^-$, $Br^-/Br_3^-$ is preferably used. At the time of forming, for example, a pair of I⁻/I₃⁻, a mixture of iodine ammonium salt and iodine, is used as a solute of the electrolytic solution 63.

Finally, it is preferable to seal the obtained cell with an adhesive to provide durability.

Next, the action principle of the Graetzel type cell will be described below. Light is radiated to the Graetzel type cell from the left side shown in FIG. 6. Subsequently, electrons of the coloring agent constituting the light absorption layer 62 are excited owing to the incident light. The excited electrons are efficiently injected to the titanium oxide layer 61 and transferred to a conduction band of titanium oxide. The coloring agent which loses electrons and falls into an oxidized state is quickly reduced by receiving electrons from iodine ions in the electrolytic solution 63 and is returned to its original state. The electrons injected into the titanium oxide layer 61 are moved owing to a mechanism such as hopping conduction among the titanium oxide fine particles and reach the anode 15a (the left side transparent electrode in FIG. 6). On the other hand, the iodine ions which are in oxidized state (I₃⁻) by supplying electrons to the coloring agent are reduced by receiving electrons from the cathode (the right side transparent electrode in FIG. 6) 15b and turn back to their original state (I⁻).

As is suggested by such an action principle, in order to efficiently separate the electrons and the holes generated in the coloring agent and move them, the energy level of the electrons of the coloring agent in the excited state has to be higher than that of the conduction band of titanium oxide, and the energy level of the holes of the coloring agent has to be lower than the redox level of iodine ion.

Further improvements on the photoelectric conversion efficiency, the short circuit current, the open circuit voltage, the filter factor, and durability are desirable to promote replacement of a silicon solar cell with such a Graetzel type cell.

However, since the foregoing coloring agent-sensitized semiconductor electrode is a titanium oxide film produced by applying the solution containing dispersed titanium oxide fine particles to the transparent conductive film (the transparent electrode) 15a and sintering at high temperature after drying, the excited electrons tend to be scattered in the interfaces of the transparent electrode, in the titanium oxide fine particles and in the interfaces of titanium oxide fine particles themselves. The internal resistance generated in the interfaces of the transparent electrode, the titanium oxide fine particles and in the interfaces of titanium oxide fine particles themselves, therefore, is increased to result in a decrease in photoelectric conversion efficiency. Moreover, movement of the excited electrons to the redox system or the like in the interfaces of the titanium oxide fine particles themselves also causes decrease of the photoelectric conversion efficiency.

Further, since the foregoing coloring agent-sensitized semiconductor electrode comprises a sintered body of titanium oxide fine particles, problems are caused, such as, adsorption of dye in the titanium oxide fine particles located in the periphery of the transparent electrode takes a long time, and diffusion of ions in the electrolytic solution 63 is slow.

SUMMARY OF THE INVENTION

An object of the present invention is, therefore, to provide a photoelectric conversion device capable of smoothly supplying and receiving electrons and having high photoelectric conversion efficiency.

Another object of the present invention is to provide a photoelectric conversion device comprising a semiconductor electrode in which electrons, holes, and ions in a light absorption layer containing dye and a charge transfer layer containing an electrolytic solution move best and thus the light absorption layer and the charge transfer layer have excellent diffusion properties during production.

Another object of the present invention is to provide a method of producing a photoelectric conversion device having such characteristics.

The present invention, therefore, provides a photoelectric conversion device comprising at least an electron acceptive charge transfer layer, an electron donative charge transfer layer, and a light absorption layer existing between the charge transfer layers, wherein either one of the charge transfer layers is a semiconductor acicular (or needle) crystal layer comprising aggregate of acicular crystals.

The present invention further provides a method of producing a photoelectric conversion device which comprises at least an electron acceptive charge transfer layer, an electron donative charge transfer layer, and a light absorption layer existing between the charge transfer layers, the method comprising applying a solution containing acicular crystals on a substrate and firing the substrate to form a semiconductor acicular crystal layer comprising aggregate of acicular crystal on the substrate and utilizing the semiconductor acicular crystal layer as either one of the charge transfer layers.

The present invention further provides a method of producing a photoelectric conversion device which comprises at least an electron acceptive charge transfer layer, an electron donative charge transfer layer, and a light absorption layer existing between the charge transfer layers, the method comprising forming a semiconductor acicular crystal layer comprising aggregate of acicular crystals on a substrate by a CVD process and utilizing the semiconductor acicular crystal layer as either one of the charge transfer layers.

Moreover, a photoelectric conversion device comprising at least an electron acceptive charge transfer layer, an electron donative charge transfer layer, and a light absorption layer existing between the charge transfer layers, wherein either one of the charge transfer layers is a semiconductor layer comprising a mixture with two or more kinds of different morphologies (or configurations) or compositions and at least one of the kinds of the semiconductor layer is an acicular crystal.

The method of producing one of the photoelectric conversion devices of the present invention is a method of producing a photoelectric conversion device which comprises at least an electron acceptive charge transfer layer, an electron donative charge transfer layer, and a light absorption layer existing between the charge transfer layers, the method comprising applying a semiconductor mixture solution comprising a semiconductor mixture with two or more kinds of different morphologies or compositions on a substrate and firing the substrate to form a semiconductor mixed crystal layer on the substrate, and utilizing the semiconductor mixed crystal layer as either one of the charge transfer layers.

The method of producing another one of the photoelectric conversion devices of the present invention is a method of producing a photoelectric conversion device which comprises at least an electron acceptive charge transfer layer, an electron donative charge transfer layer, and a light absorption layer existing between the charge transfer layers, the method comprising the steps of applying a solution containing a semiconductor acicular crystal on a substrate and firing the substrate to form an acicular semiconductor crystal layer, further depositing a single substance or a mixture with a different morphology or composition from that of the acicular crystal to the semiconductor layer to form a semiconductor mixed crystal layer on the substrate, and utilizing the semiconductor mixed crystal layer as either one of the charge transfer layers.

The method of producing the other photoelectric conversion device of the present invention is a method of producing a photoelectric conversion device which comprises at least an electron acceptive charge transfer layer, an electron donative charge transfer layer, and a light absorption layer existing between the charge transfer layers, the method comprising the steps of growing an acicular crystal on a substrate, depositing to the acicular crystal a single substance or a mixture with a different morphology or composition from that of the acicular crystal to form a semiconductor mixed crystal layer on the substrate, and utilizing the semiconductor mixed crystal layer as either one of the charge transfer layers.

DETAILED DESCRIPTION OF THE PREFERRED EMBODIMENTS

Figure 8A:
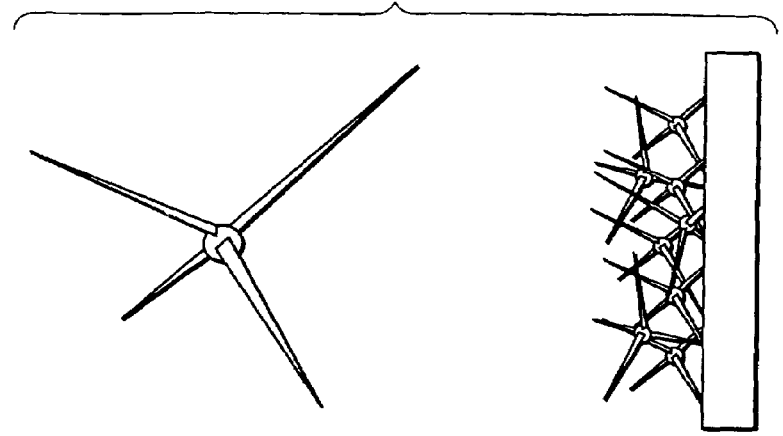
FIGS. 8A, 8B and 8C illustrate the structure of an acicular crystal.
Figure 8B:
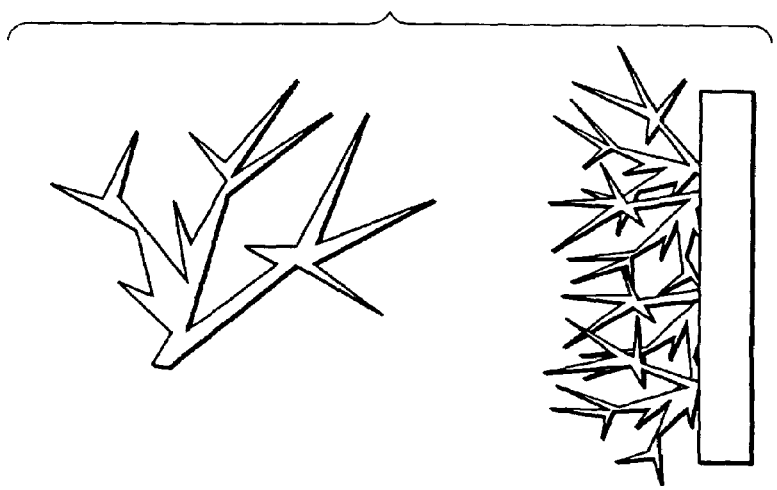
Figure 8C:
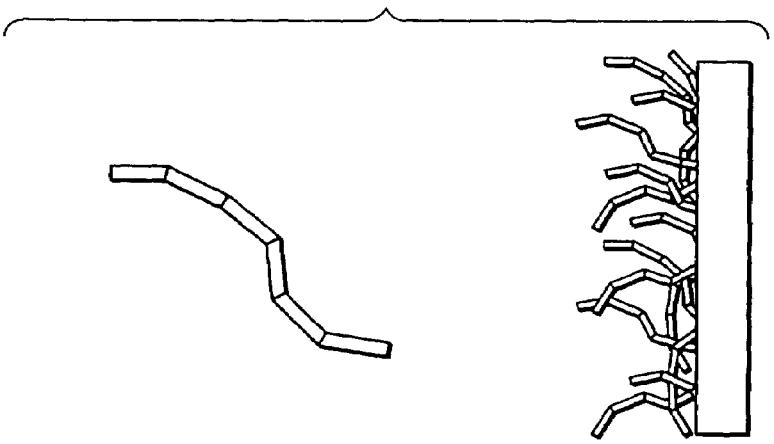

The main characteristic of a photoelectric conversion device of the prevent invention is that an acicular crystal is used for an electron acceptive (n-type) or an electron donative (p-type) charge transfer layer. The acicular crystal means so-called whisker and preferably includes a defect-free acicular single crystal and an acicular crystal containing screw dislocation. As illustrated in FIGS. 8A, 8B and 8C, the acicular crystal in the present invention also includes a crystal having a large number of acicular crystals grown from one point as to form various shapes including a tetrapod-like shape (FIG. 8A), a dendrite shape (FIG. 8B), and a broken line-like shape (FIG. 8C).

Further, the acicular crystal of the present invention includes those with all kinds of shapes such as cylindrical, conical, conical with truncated ends, cylindrical with sharpened tips or flat tips. Moreover, the acicular crystal includes those with triangular pyramid, rectangular pyramid, hexagonal pyramid, and other polygonal pyramid shapes including ones with truncated ends. The acicular crystal also includes those with triangular prism, rectangular prism, hexagonal prism, tip-sharpened triangular prism, tip-sharpened rectangular prism, tip-sharpened hexagonal prism, and other polygonal prism shapes including sharpened tip-levelled ones. Furthermore, the crystal includes those with broken line structure of above described shapes.

Figure 10A:
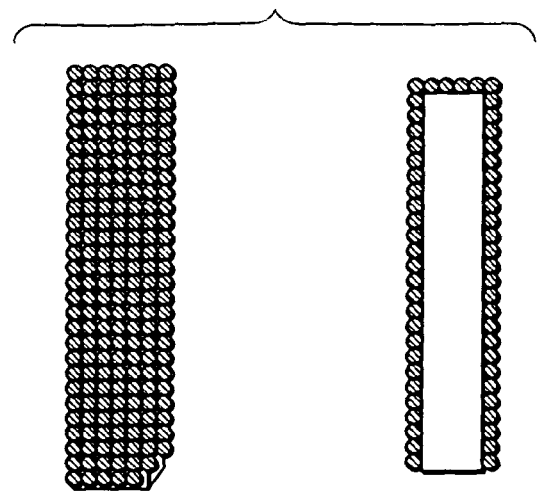
FIGS. 10A, 10B and 10C are cross-sectional views illustrating the state of a mixed crystal.
Figure 10B:
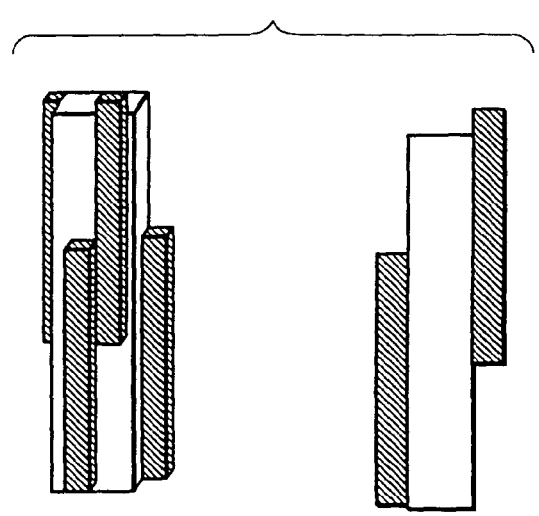
Figure 10C:
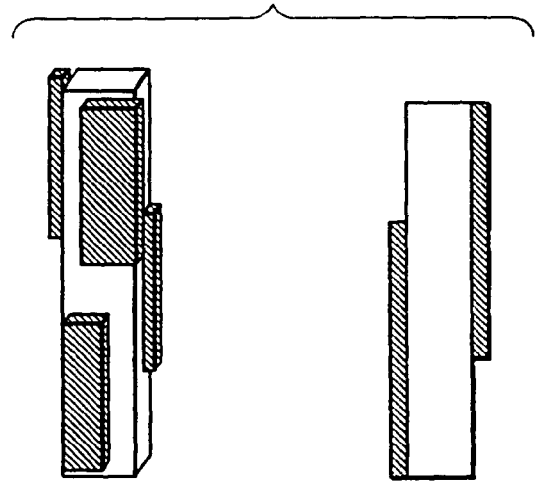

Either one of the charge transfer layers is a semiconductor layer containing a mixture with two or more different morphologies or with two or more different compositions, and one or more of the semiconductor layers are a mixed crystal containing an acicular crystal. Examples of morphology of the mixed crystal are illustrated in FIGS. 10A, 10B and 10C. Respectively, FIG. 10A shows an acicular crystal bearing surrounding particles. FIG. 10B shows an acicular crystal bearing a surrounding acicular substance. FIG. 10C shows an acicular crystal bearing a surrounding film-like substance.

In order to effectively explain the effects of an acicular crystal and its mixed crystal, cells of the present invention will be described while being compared with a conventional Graetzel type cell.

Figure 1A:
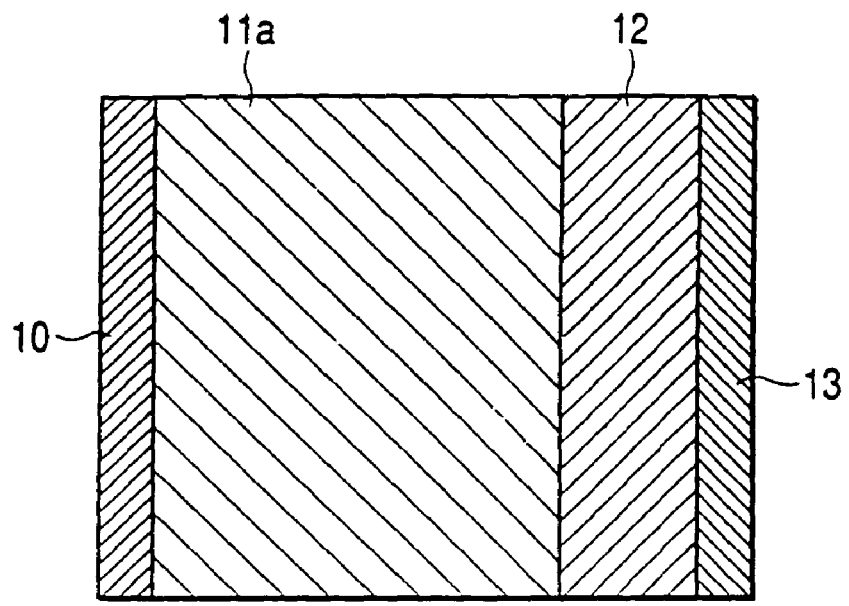
FIGS. 1A, 1B, 1C and 1D are outline cross-sectional views showing photoelectric conversion devices of the present invention.
Figure 1B:
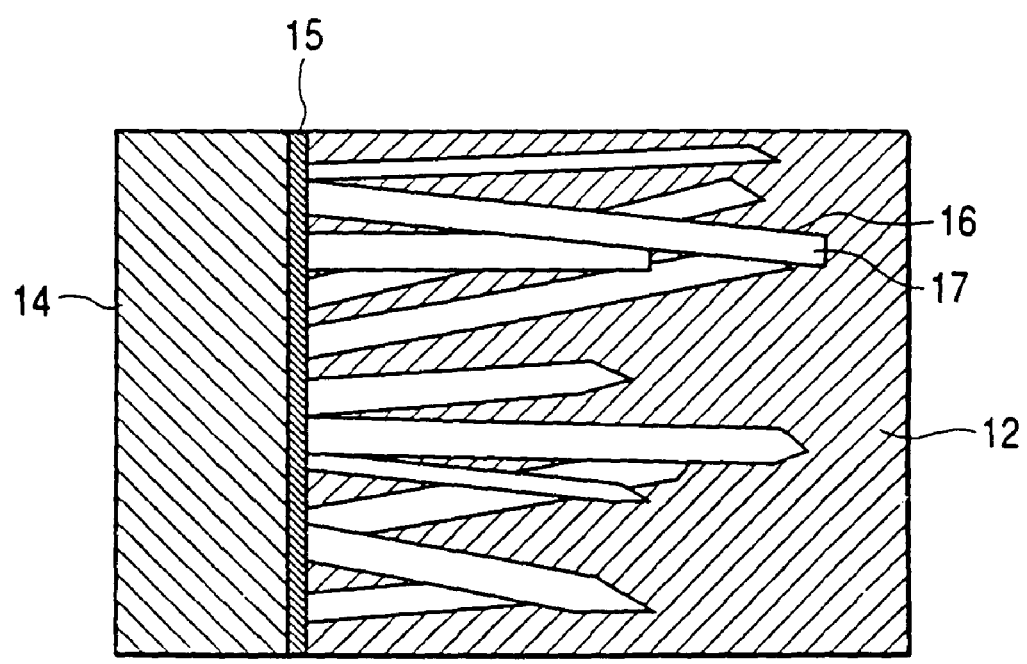
Figure 1C:
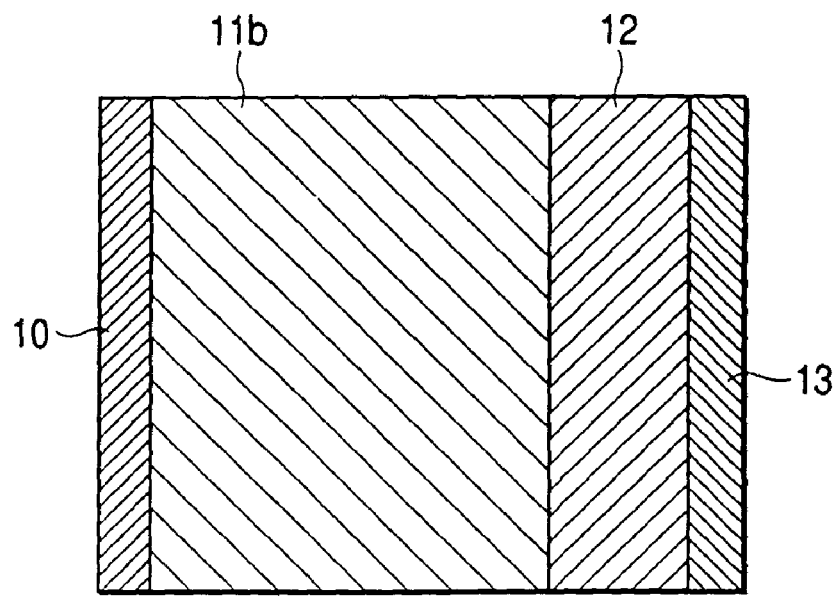
Figure 1D:
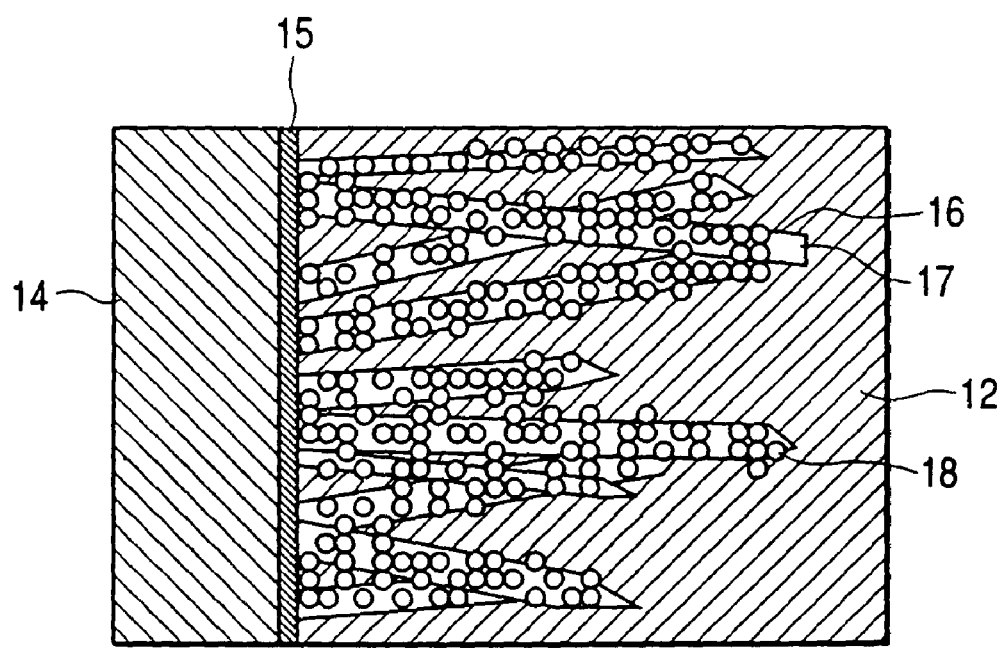

FIGS. 1C and 1D are outline cross-sectional views showing photoelectric conversion devices of the present invention. In these figures, 10 denotes a substrate bearing an electrode, 11b denotes an absorption layer-modified semiconductor mixed crystal layer, 12 denotes a charge transfer layer, and 13 denotes a substrate bearing an electrode. The substrate bearing an electrode 10 is, for example, a glass substrate 14 on which a transparent electrode layer 15 is formed. The absorption layer-modified semiconductor mixed crystal layer 11 comprises a semiconductor acicular crystal 17 and a light absorption layer 16 formed on the surface of the crystal. The semiconductor acicular crystal 17 is used as one charge transfer layer and the light absorption layer 16 is formed between the charge transfer layer and the other charge transfer layer 12.

<Regarding the Constitution of a Photoelectric Conversion Device of the Present Invention>

In a dye-sensitized type cell represented with the foregoing Graetzel type cell, since the light absorbency of one coloring agent layer is insufficient, the surface area of the light absorption layer is widened to increase the practical quantity of absorbed light. In order to increase the surface area, a method of dispersing and binding the fine particles may be employed, as in the foregoing Graetzel type cell. But by this method, there occurs the problem that the electron transfer efficiency is not sufficient. In the foregoing Graetzel type cell, for example, the photoelectric conversion efficiency is sometimes higher in the case where light incidence is carried out from the side of the transparent electrode 15a having the titanium oxide semiconductor layer 61 than in the case where light incidence is carried out from the opposite electrode 15a side. This not only shows the difference of the quantity of the light according to absorbance by the coloring agent, but also suggests according to the possibility that electrons excited by the light absorbance which move the titanium oxide semiconductor layer 61 and reach the transparent electrode 15a tend to be decreased more as the distance between the light excitation position and the transparent electrode becomes greater. In other words, it can be suggested that electrons are not sufficiently moved in the Graetzel type cell having many crystal grain boundaries.

An example of photoelectric conversion devices of the present invention will be described with reference to FIGS. 1A to 1D and FIGS. 2A to 2C.

FIG. 1A is an outline cross-sectional view showing an example of the photoelectric conversion devices of the present invention. In the figure, 10 and 13 denote substrates bearing electrodes, 11a denotes a semiconductor acicular crystal layer having a light absorption layer on the surface (absorption layer-modified semiconductor acicular crystal layer), and 12 denotes a charge transfer layer. FIG. 1B is a partly enlarged cross-sectional view of the cross-sectional view of FIG. 1A and in the figure, 14 denotes a glass substrate and 15 denotes a transparent electrode and they are equivalent to the substrate 10 bearing an electrode of FIG. 1A. Further, 16 denotes a light absorption layer and 17 denotes a semiconductor acicular crystal and they are equivalent to the light absorption layer-modified semiconductor acicular crystal layer 11a.

FIGS. 1C and 1D are outline cross-sectional views showing other examples of the photoelectric conversion devices of the present invention. In those figures, 10 denotes a substrate bearing an electrode, 11b denotes an absorption layer-modified semiconductor mixed crystal layer, 12 denotes a charge transfer layer, and 13 denotes a substrate bearing an electrode. The substrate 10 bearing an electrode is, for example, a glass substrate 14 on which a transparent electrode layer 15 is formed, the absorption layer-modified semiconductor mixed crystal layer 11b comprises a semiconductor acicular crystal 17 and a light absorption layer 16 formed on the surface. The semiconductor acicular crystal 17 works as one of the charge transfer layers and thus the light absorption layer 16 is to be positioned between this charge transfer layer and the other charge transfer layer 12.

As compared with a fine particle crystal layer, the mixed crystal layer of the present invention has a low possibility of scattering of electrons or holes generated by photoexcitation by grain boundaries until the electrons or holes reach a current collector. Especially, as shown in FIG. 1D, in the case where the mixed crystal layer is so formed as to join one end of each of the acicular crystals to an electrode and to bond different types of micro crystals to the acicular crystals by sintering, the effects of grain boundaries on movement of electrons or holes are almost completely eliminated as compared with a case of a Graetzel type cell.

A photoelectric conversion device of the present invention preferably comprises an acicular crystal or a mixed crystal for an n-type wide gap semiconductor or a p-type wide gap semiconductor. In the case where the acicular crystal or the mixed crystal is an n-type wide gap semiconductor, a p-type wide gap semiconductor or an electron donative charge transfer layer 12 of an electrolytic solution containing a redox pair or of a conductive polymer is required to be on the opposite side to the n-type wide gap semiconductor while sandwiching a light absorption layer 16 (containing, for example, dye). On the other hand, in the case where the acicular crystal or a mixed crystal is a p-type wide gap semiconductor, an electron acceptive charge transfer layer 12 is required to be on the opposite side to the p-type wide gap semiconductor while sandwiching a light absorption layer 16.

Figure 2A:
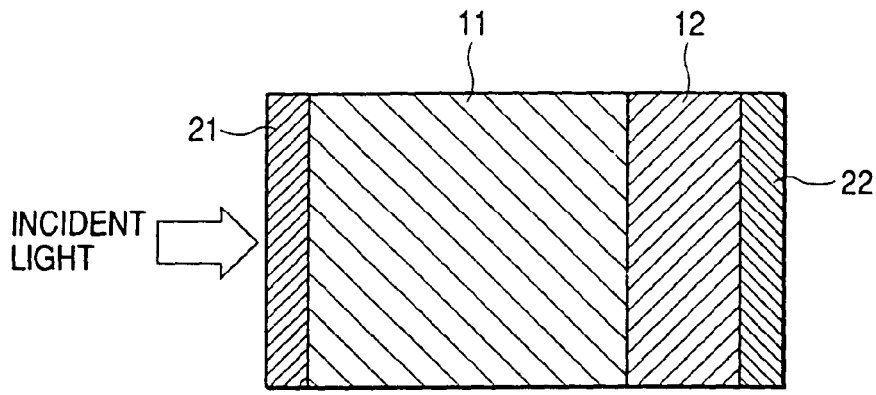
FIGS. 2A, 2B and 2C are cross-sectional views illustrating the constitution examples of light radiation, the transparent electrodes, and mixed crystal layers of the present invention.
Figure 2B:
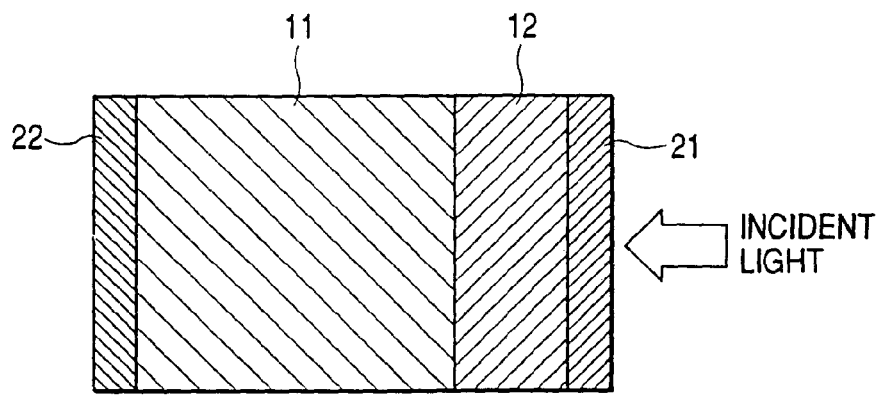
Figure 2C:
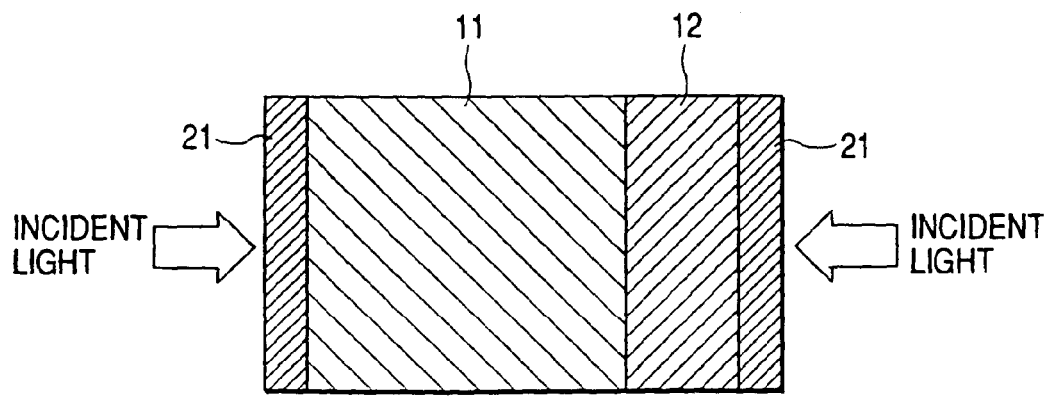

In the case where either one of the substrates 10 or 13 bearing electrodes is set to be a light incident plane, the electrode and the substrate have to be transparent at least in the light incident side. FIGS. 2A, 2B and 2C are outline cross-sectional views illustrating practical examples of photoelectric conversion devices of the present invention, and in the figures, 21 denotes a glass substrate bearing a transparent electrode, and 22 denotes an electrode having no transmissivity (or a substrate bearing an electrode having no transmissivity). In the constitution illustrated in FIG. 2A, the glass substrate 21 bearing an electrode is formed in the side of the absorption layer-modified semiconductor acicular crystal layer 11 (the absorption layer-modified semiconductor mixed crystal layer in the constitutions illustrated in FIGS. 1C and 1D) to carry out light incidence from the left side of the figures. To the contrary, in the constitution illustrated in FIG. 2B, the glass substrate 21 bearing a transparent electrode is installed in the charge transfer layer 12 side to carry out light incidence from the right side of the figure. As long as the absorption or reflection of incident light to the light absorption layer 16 can be negligible, any constitution is applicable. Further, as illustrated in FIG. 2C, the constitution may be such as to use the glass substrate 21 bearing a transparent electrode for both sides and to carry out light incidence from any side.

The constitution may optionally be selected among the exemplified constitutions in accordance with the formation method of the semiconductor crystal layer 11, the formation method and the composition of the charge transfer layer 12, and so forth. In the case where, for example, the acicular crystal layer is formed by oxidizing a metal substrate, the acicular crystal side is inevitably used as the electrode with no light transmissivity. On the other hand, in the case where the acicular crystal layer is formed by firing an acicular crystal powder, the acicular crystal side can be employed as the glass substrate bearing a transparent electrode. This is because the acicular crystal layer can be formed at a relatively low temperature and the transparent electrode is scarcely deteriorated during the acicular crystal formation process.

Figure 6:
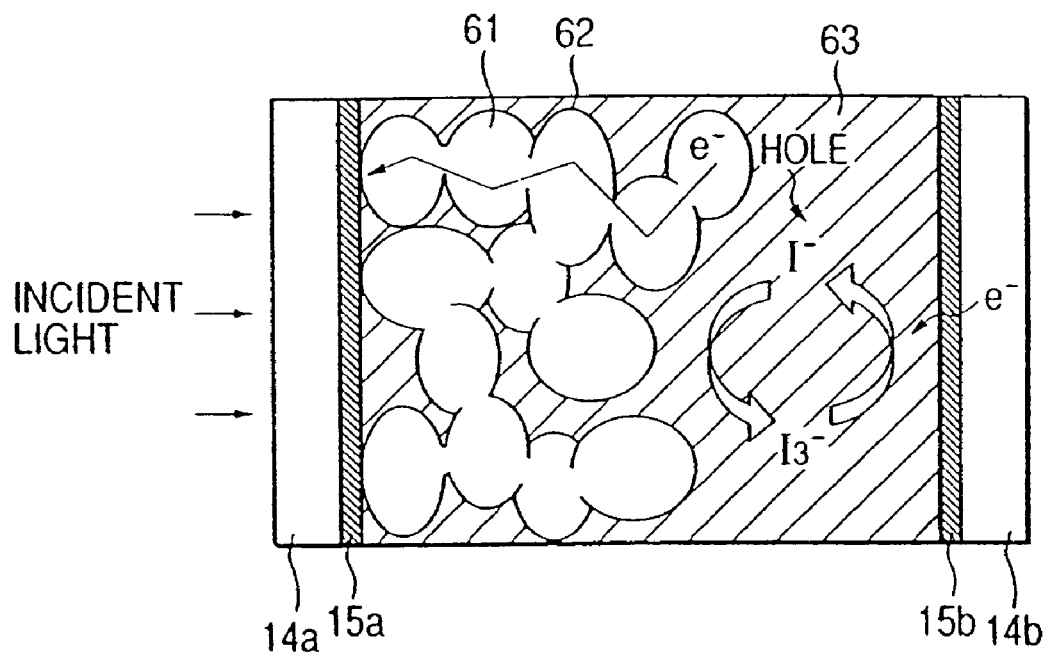
FIG. 6 is a cross-sectional view of a conventional example of a Graetzel type cell.
Figure 9A:
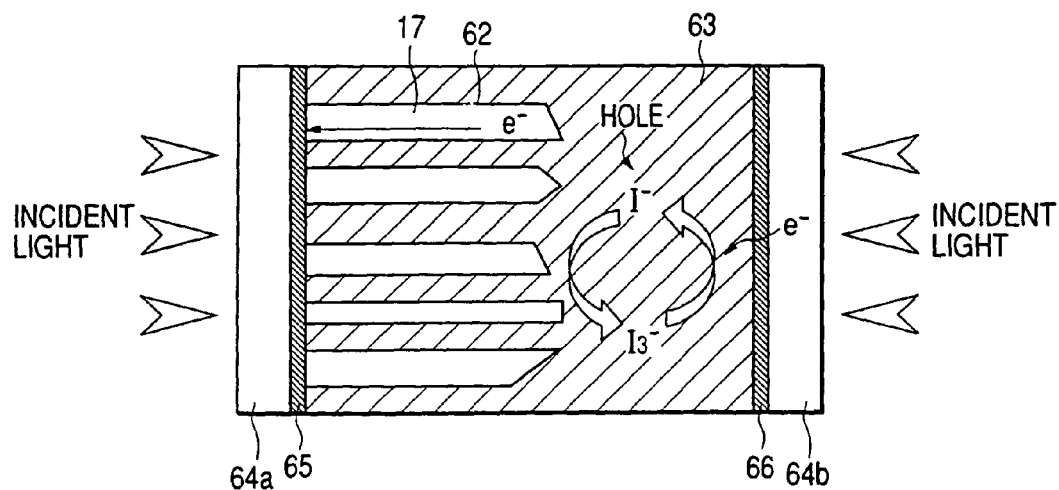
FIGS. 9A and 9B are cross-sectional views illustrating a cell employing an acicular crystal and a mixed crystal.
Figure 9B:
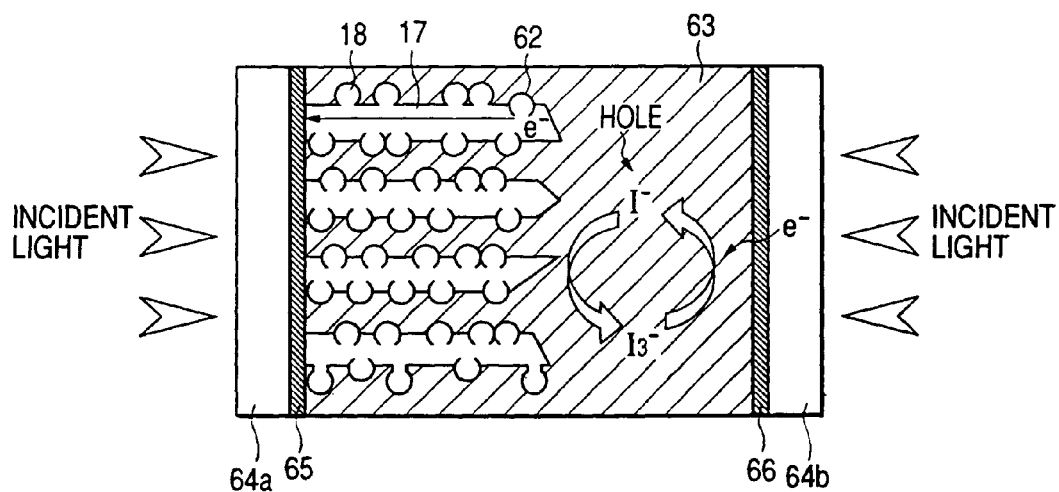

FIGS. 9A and 9B are figures illustrating practical constitutions of the foregoing acicular crystal and mixed crystal. As compared with the Graetzel type cell shown in FIG. 6, the effects of grain boundaries are almost completely eliminated, so that electrons and holes can easily be moved. Further, as shown in FIG. 9B, a semiconductor crystal 18 is adsorbed in the acicular crystal 17, so that the effects of the grain boundaries can be suppressed and roughness factor can be improved and, moreover, the radiated light can reach a wide range of areas even if light is radiated to any plane. Therefore, a large number of electrons are enabled to move to obtain a cell of a photoelectric conversion device with high conversion efficiency.

The mixed crystal to be employed for the present invention will be described below.

<Regarding an Acicular Crystal and a Mixed crystal>

In the case of a cell just like the foregoing Graetzel type cell which has a light absorption layer with low absoptance per one layer, the roughness factor is increased by using a fine particle film with a high porosity in order to increase the surface area. On the other hand, even in the case of using an acicular crystal, the roughness factor can be increased if its aspect ratio is high and the roughness factor can further be increased by sintering a micro crystal in the surrounding of the acicular crystal.

The transverse cross-section of the acicular crystal can have different shapes. Such as triangular, rectangular, hexagonal, or other polygonal shape. This includes an almost round cross-section. The respective sides may not necessarily be equal and are sometimes different. As described before, the acicular crystal includes those with truncated and flat ends beside those with sharpened tips. The desirable aspect ratio of the acicular crystal is not lower than 5, preferably not lower than 10, and further preferably not lower than 1000, though it depends on the absorptance. Additionally, the diameter of the acicular crystal is preferably 1 µm or less and more preferably 0.1 µm or less.

The aspect ratio in this case means the ratio of the length of the acicular crystal to the diameter in the case where the acicular crystal has a round or an approximately round transverse cross-section and the ratio of the length to the shortest length of a line passing the gravity center of the cross-section in the case where the acicular crystal has a polygonal, e.g. hexagonal, cross-section.

As a material for the acicular crystal and the mixed crystal, those having wide energy gaps are preferable and practically, those having 3 eV or wider energy gaps are preferable. Metal oxides are preferable to be used as materials for the acicular crystal. As a material for the electron acceptive (n-type) crystal, for example, $TiO_2$, ZnO, $SnO_2$, or the like are preferable and as a material for the electron donative (p-type) crystal, for example, NiO, CuI, or the like are preferable.

Figure 3A:
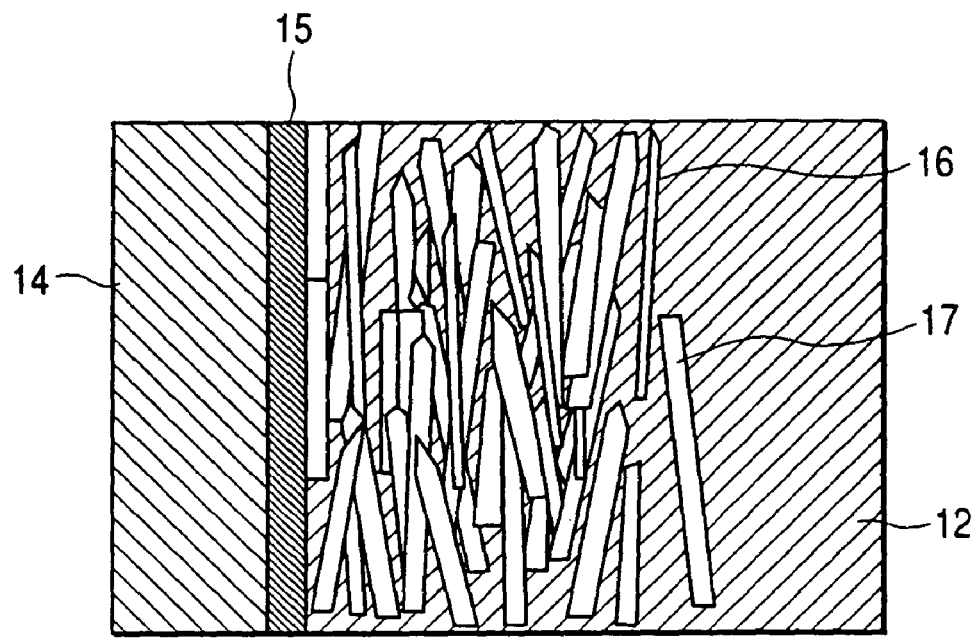
FIGS. 3A, 3B, 3C and 3D are cross-sectional views illustrating the bonding state of the mixed crystal of the present invention.
Figure 3B:
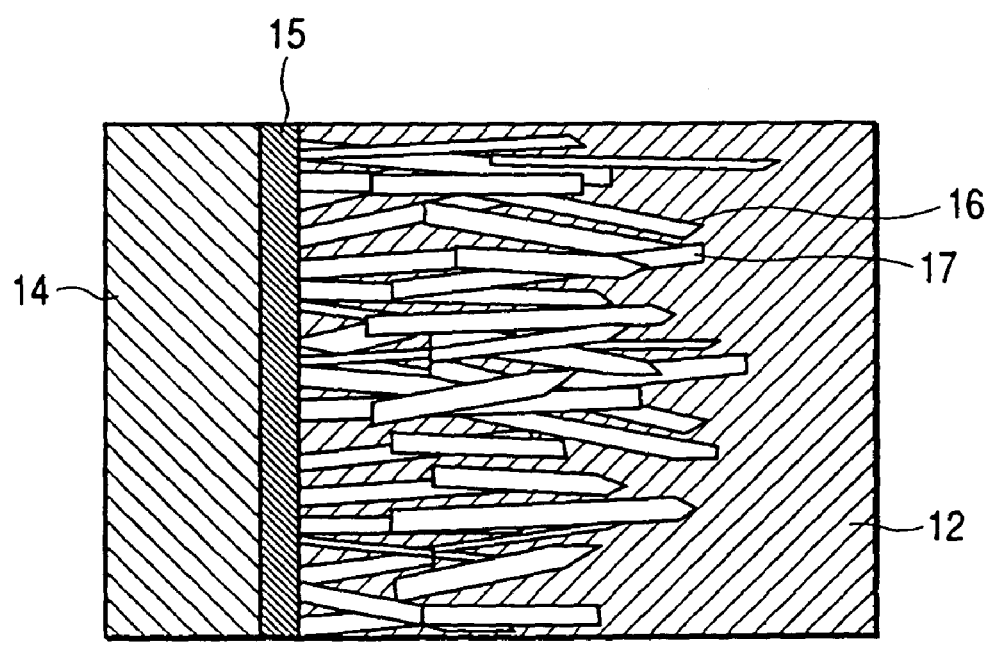

As a method of acicular crystal formation, a method involving applying an acicular crystal powder and firing the powder just like in the case of production of the foregoing Graetzel cell is applicable. In this case, it is preferable that the acicular crystals are approximately vertical to a substrate 14 while one end of the acicular crystals is joined to the transparent electrode 15 as shown in FIG. 3B and FIG. 1B rather than the acicular crystals being parallel to the substrate 14 as shown in the outline cross-section illustrated in FIG. 3A. In addition to that, in the case where no transparent electrode 15 exists and the substrate works also as an electrode, one end of the acicular crystals is preferably joined to the principal plane of the substrate. The angle formed between the axial direction of the acicular crystals and the principal plane of the substrate is preferably 60° or wider and more preferably 80° or wider.

Figure 3C:
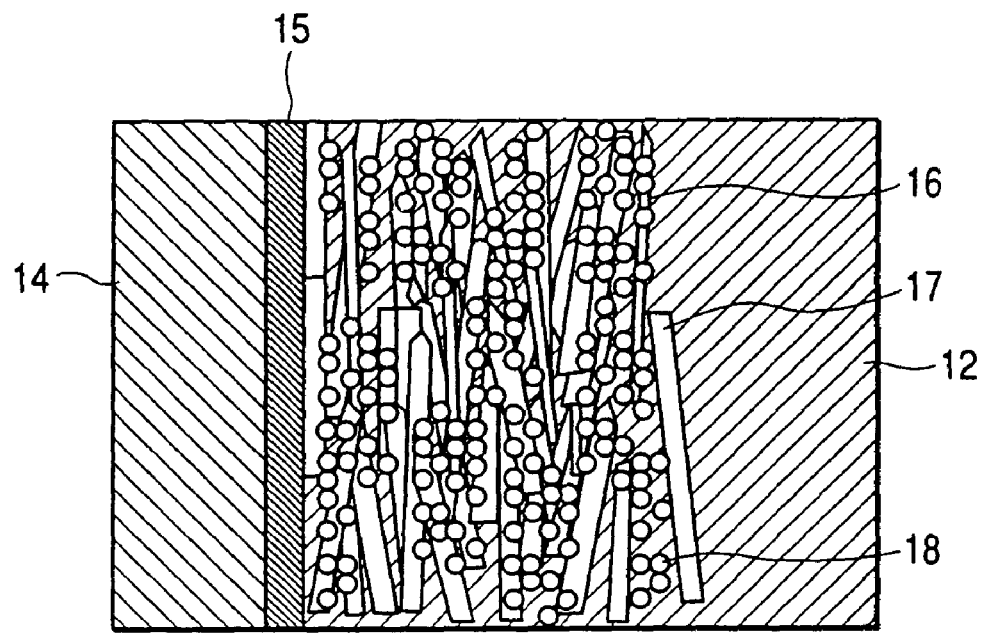
Figure 3D:
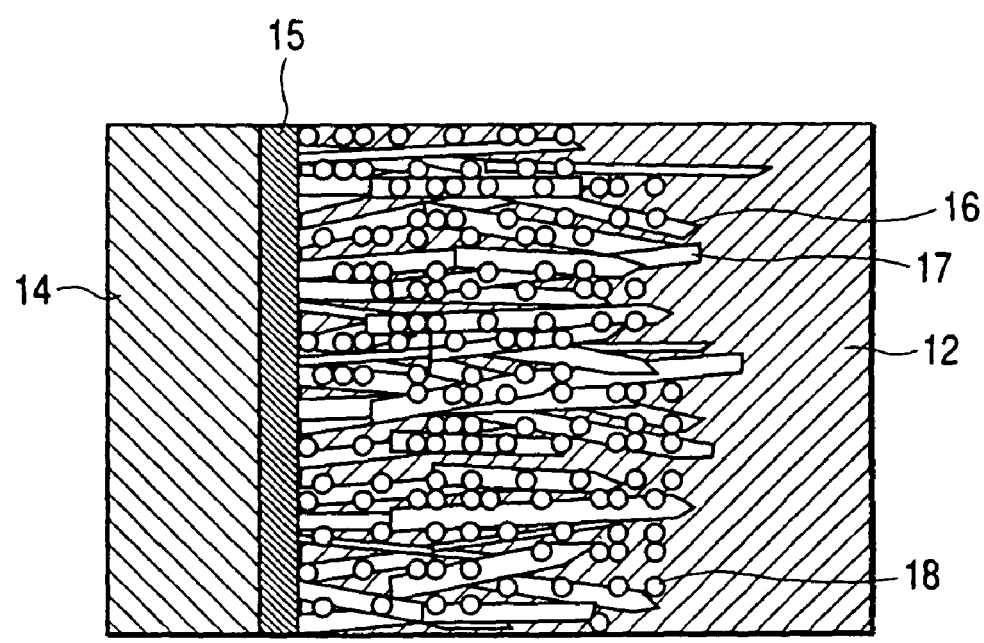

As a method of mixed crystal formation, the foregoing method involving applying a mixed crystal powder and firing the powder is applicable. In this case, it is preferable that the acicular crystals are approximately vertical to a substrate 14 while one end of the acicular crystals is joined to the transparent electrode 15 as shown in FIG. 3D and FIG. 1D rather than the acicular crystals being parallel to the substrate 14 as shown in the outline cross-section illustrated in FIG. 3C. In addition to that, the angle formed between the axial direction of the acicular crystals and the principal plane of the substrate is preferably 60° or wider and more preferably 80° or wider. Also, there are available the methods of applying a semiconductor crystal 18 after being previously mixed or of applying one or more types of semiconductor crystals first and then applying others thereon. The semiconductor crystals 18 are preferably fine particles with 100 nm or smaller, preferably 20 nm or smaller, diameter.

Other methods for growing an acicular crystal on an electrode such as the transparent electrode 15 are further available. Mainly two methods are applicable to carry out the acicular crystal growth: one is by supplying the crystal components from the outside, including the CVD method, PVD method, and electrodeposition method, and the other is by causing reaction of the components of the electrode to grow the acicular crystal.

Figure 5A:
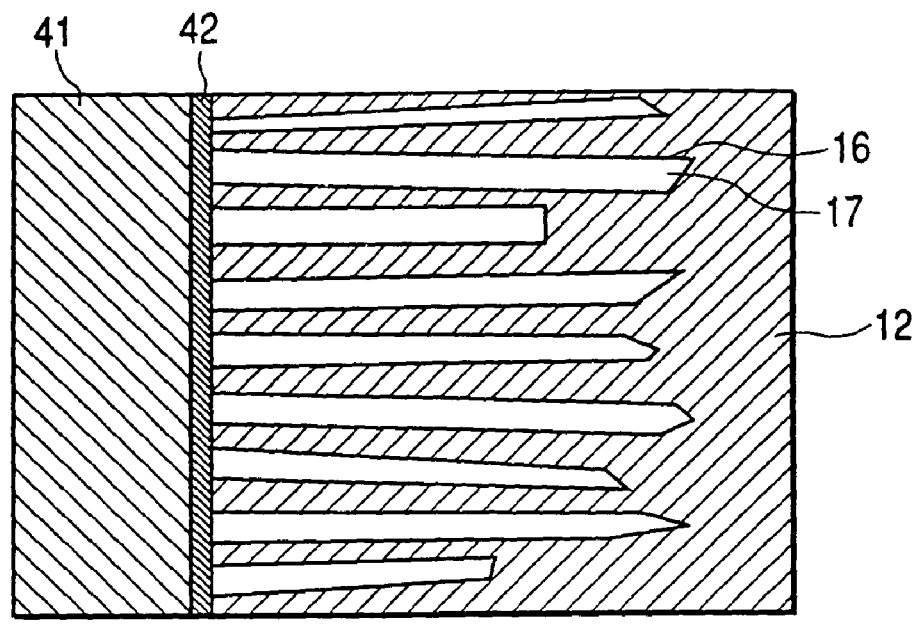
FIGS. 5A, 5B, 5C and 5D are cross-sectional views illustrating the mixed crystals from the substrate of the present invention.
Figure 5B:
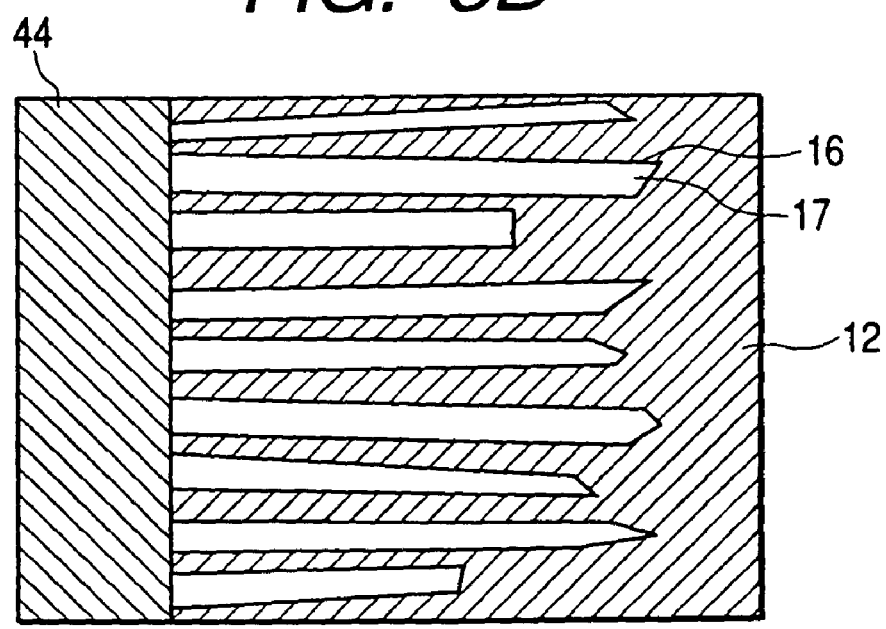
Figure 5C:
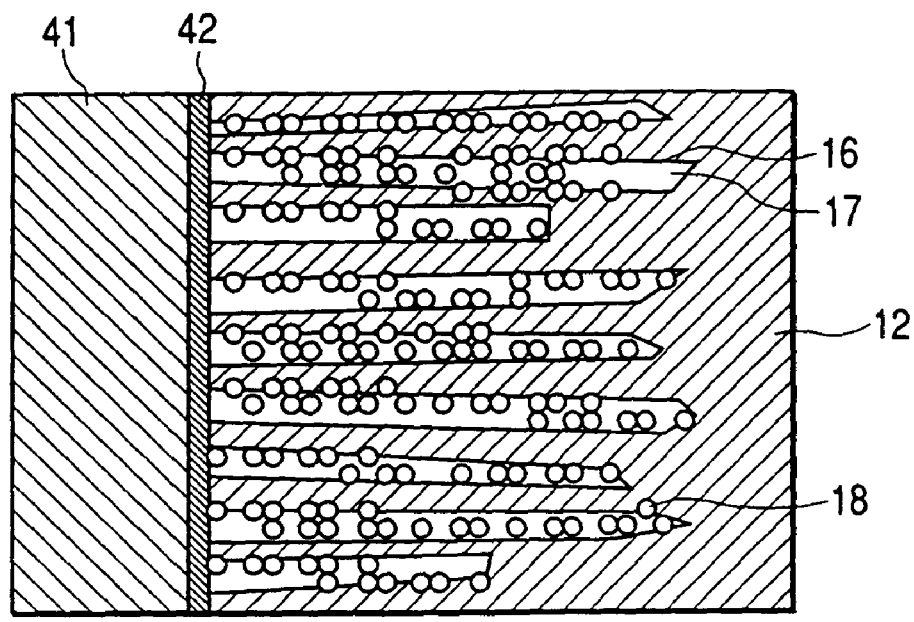
Figure 5D:
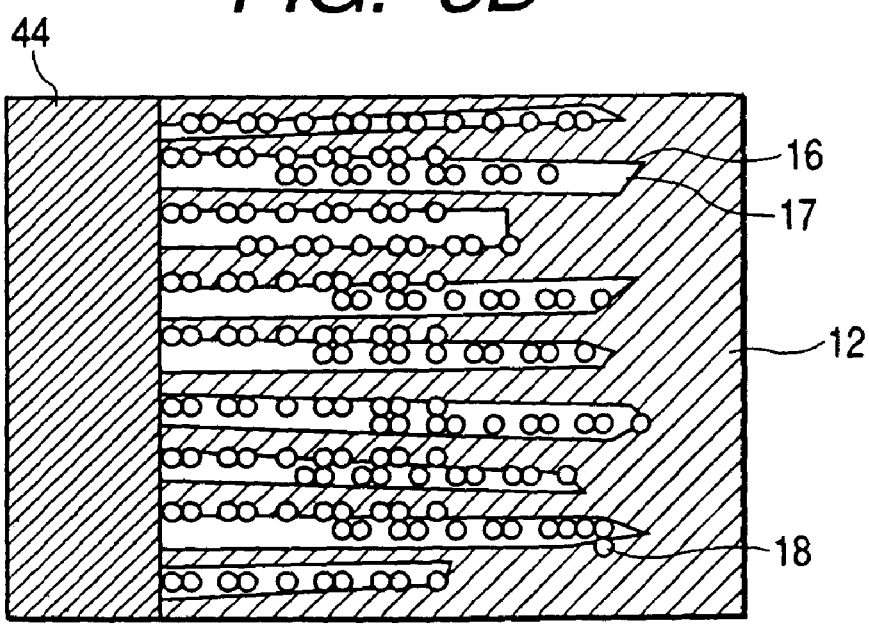

The following are practical methods for the former: a method involving steps of forming the undercoating electrode layer (a metal layer) 42 on the substrate 41, as illustrated in the cross-sectional views of FIGS. 5A and 5C, and then growing an acicular crystal of $TiO_2$, ZnO, or the like on the under electrode layer 42 by open-to-atmosphere type CVD method and, in the case of forming a mixed crystal, further depositing a semiconductor crystal of such as $TiO_2$, ZnO, or the like thereon, and another method involving steps of growing an acicular crystal of $TiO_2$, ZnO, or the like directly on the metal substrate 44, which works also as an under electrode, by open-to-atmosphere type CVD method as illustrated in the cross-sectional views of FIGS. 5B and 5D and, in the case of forming a mixed crystal, further applying the semiconductor crystal 18 thereto.

The following are practical methods for the latter: a method involving steps of forming the undercoating electrode layer (a metal layer) 42 of Ti, Zn or the like on the substrate 41, as illustrated in the cross-sectional views of FIGS. 5A and 5C, and then growing an acicular crystal by oxidizing the surface of the undercoating electrode layer 42 or by CVD method and another method involving steps of growing an acicular crystal by directly oxidizing the metal substrate 44, which works also as an under electrode as illustrated in the cross-sectional views of FIGS. 5B and 5D. A method of growing the acicular crystal from nano holes is available for controlling the diameter and the growth direction of the acicular crystal. For example, as illustrated in the cross-sectional views of FIGS. 4A to 4D, an aluminium layer with 0.1 to 10 µm thickness is formed on the undercoating electrode layer 42 or the metal substrate 44 and a nano hole layer (a finely porous layer) 43 of alumina is formed by anodizing the resultant aluminium layer. The anodization is carried out using, for example, oxalic acid, phosphoric acid, sulfuric acid, or the like. The gaps between the neighboring nano holes can be controlled by controlling the voltage for anodization. The diameter of the nano holes can also be controlled by carrying out etching with a phosphoric acid solution after the anodization. The semiconductor acicular crystal is grown through the nano holes by gradually oxidizing the resultant substrate 44 in an oxygen atmosphere or steam-containing atmosphere to oxidize the undercoating electrode layer 42 or the naked part of the metal substrate 44 after the nano hole layer 43 is formed.

In the case where the acicular crystal is grown by oxidation, the length and the diameter can be controlled by the oxidation conditions.

A structure where the semiconductor crystal 18 exists in the surface of the semiconductor acicular crystal 17, as illustrated in FIGS. 5C and 5D, can be created by forming the acicular crystal with controlled diameter and growth direction, and after that, immersing the resultant electrode in a gel solution containing different types of semiconductor crystals. Consequently, even in the case where the diameter or the length of the acicular crystal is insufficient, a semiconductor crystal with a high roughness factor can be produced and as a result, a semiconductor mixed crystal with scarce effects of grain boundaries on the movement of electrons or holes can be produced.

<Regarding Light Absorption Layer>

Various kinds of semiconductors and coloring agents are usable for the light absorption layer of the photoelectric conversion devices of the present invention. An amorphous semiconductor and a direct transition type semiconductor with i-type and a high light absorption coefficient are preferable for the semiconductors. A metal complex coloring agent and/or organic and natural coloring agents such as a polymethine coloring agent, a perylene coloring agent, rose Bengal, Santaline coloring agent, Cyanin coloring agent, or the like are preferable for the coloring agents. The coloring agents preferably have proper bonding groups for forming bonds to the surface of the semiconductor fine particle. The preferable bonding groups are COOH group, cyano group, $PO_3H_2$ group, and chelating groups having π-conduction such as oxime, dioxime, hydroxyquinoline, salicylate, and α-keto-enolate. Among them, the COOH and $PO_3H_2$ groups are especially preferable. In the case where the coloring agent to be used for the prevent invention is a metal complex coloring agent, a ruthenium complex coloring agent {Ru$(dcbpy)_2(SCN)_2$; (dcbpy=2,2-bipyridine-4,4'-dicarboxylic acid) or the likes} can be usable and it is important for the coloring agent to have stable oxidized and reduced states.

Further, it is necessary for the electric potential of electrons excited in the light absorption layer, that is the electric potential (LUMO potential of dye) of dye excited by photoexcitation, and for the electric potential of the conduction band of the semiconductor to be higher than the electron acceptive potential (the conduction band potential of the n-type semiconductor) of the electron acceptive charge transfer layer and for the electric potential of holes generated in the light absorption layer by photoexcitation to be lower than the electron donative potential (the valence band of the p-type semiconductor, potential voltage of the redox pair, or the like) of the electron donative charge transfer layer. Lowering the probability of recombination of excited electrons and holes in the periphery of the light absorption layer is also important in order to increase the photoelectric conversion efficiency.

<Regarding Acicular Crystal and Opposite Charge Transfer Layer>

In the case where an n-type acicular crystal or a mixed crystal is employed, a hole transfer layer is required to be formed on the opposite side to the other charge transfer layer while sandwiching a light absorption layer 12. On the contrary, in the case where a p-type acicular crystal or a mixed crystal is employed, an electron transfer layer is required to be formed as a charge transfer layer while sandwiching a light absorption layer 12. As the charge transfer layer, a redox type transfer layer similar to that of the Graetzel type cell can be employed. As the redox type charge transfer layer, not only a simple solution can be used, but also a carrier produced from a carbon powder, a material produced by gelling an electrolytic substance, or the like can be used. Also, a molten salt, an ion conductive polymer, an electrochemically polymerized organic polymer, etc. may be usable. As the hole transfer layer, a p-type semiconductor such as CuI, CuSCN, NiO, etc. may be used. As the electron transfer layer, an n-type semiconductor such as ZnO, $TiO_2$, $SnO_2$, etc. may be used.

Since the charge transfer layer must be entered among the acicular crystals or the mixed crystals, a method to be employed is the method applicable for forming a transfer layer of a liquid or a polymer and the plating method and CVD method applicable for forming a solid transfer layer.

<Regarding the Electrode>

An electrode is so formed as to be adjacent to a charge transfer layer and a semiconductor acicular crystal layer. The electrode may be formed in the whole surface or a part of the surface in the outsides of those layers. In the case where the charge transfer layer is not a solid, the electrode is preferably formed in the whole surface from a viewpoint of holding the charge transfer layer. It is also preferable to form a catalyst of Pt, C, or the like on the surface of the electrode neighboring the charge transfer layer in order to efficiently carry out reduction of, for example, a redox pair.

A transparent electrode made of ITO (indium tin oxide) and a tin oxide doped with F and Sb are suitable for use as the electrode in the light incident side. In the case where the resistance of the layer (a charge transfer layer or a semiconductor acicular crystal layer or a semiconductor mixed crystal layer) adjacent to the electrode in the light incident side is sufficiently low, a partial electrode, for example, a finger electrode or the like can be formed as the electrode in the light incident side.

As the electrode which is not employed in the light incident side, a metal electrode comprising of Cu, Ag, Al or the like is preferably used.

<Regarding the Substrate>

The material and the thickness of a substrate are properly selected corresponding to the durability required for a photovoltaic force generating device. It is necessary that the substrate in the light incident side is transparent, and a glass substrate, a plastic substrate, or the like is suitable to be used. As the substrate which is not employed for that in the light incident side, a metal substrate, a ceramic substrate, or the like is suitable to be used. It is preferable to form a reflection preventing film of $SiO_2$ or the like on the surface of the substrate in the light incident side.

Employing a substrate of a different material from the foregoing electrode may be made unnecessary by using the electrode also as the substrate.

<Regarding Sealing>

Though it is not illustrated in the Figs., a photoelectric conversion device of the present invention is preferably sealed in at least parts besides the substrates from a viewpoint of improvement of the weathering resistance. An adhesive and resin may be used as the sealing material. In the case where the light incident side is sealed, the sealing material to be used has to be transparent.

The present invention is not limited to coloring agent sensitizing type photoelectric conversion devices but applicable widely to photoelectric conversion devices constituted as to have a large surface area to increase the light absorptance.

EXAMPLES

The present invention will be further described with following examples.

Example 1

A production example of a photoelectric conversion device comprising a semiconductor acicular crystal layer formed using a rutile type acicular crystal powder as an electron acceptive charge transfer layer will be described in the present example.

A slurry was produced by mixing 6 g of rutile type $TiO_2$ crystal having 100 to 200 nm diameter and the length about 10 times as long as the diameter (aspect ratio about 10) with 10 g of water, 0.2 g of acetylacetone, and 0.2 g of Triton X. The slurry was applied to a conductive glass (a glass plate on which a F-doped $SnO_2$ film was formed) [sheet resistance 100 Ω/□] in about 50 μm thickness and 1 $cm^2$ square using a spacer, and then the resultant glass was fired at 450° C. for 1 hour in oxygen gas flow at 10 sccm to obtain a conductive glass bearing a $TiO_2$ acicular crystal layer. The thickness of the $TiO_2$ semiconductor acicular crystal layer (an electron acceptive charge transfer layer) after firing was about 10 μm.

As dye, Ru$(dcbpy)_2(SCN)_2$ was dissolved in distilled ethanol and the above described conductive glass bearing the TiO$_2$ acicular crystal layer was immersed in the solution for 30 minutes to adsorb the coloring agent to the acicular crystal layer, and then the conductive glass was taken out of the solution and dried at 80° C.

A mixed solution (a redox pair: I$^-$/I$_3^-$) containing 0.46 M of tetrapropylammonium iodide and iodine (0.06 M) as a solute and 80 vol. % of ethylene carbonate as a solvent was produced. The solution was dropwise applied to the TiO$_2$ acicular crystal layer of the conductive glass bearing the TiO$_2$ acicular crystal layer.

Another conductive glass (a glass plate on which a F-doped SnO$_2$ [sheet resistance 100 Ω/□] film was formed) bearing a platinum layer of 1 nm thickness formed by sputtering was produced, and this conductive glass and the conductive glass bearing the TiO$_2$ acicular crystal layer were set on the opposite side to each other as to set the platinum layer and the TiO$_2$ acicular crystal layer in the inner side, and the foregoing mixed solution was held between both glass plates to obtain a photoelectric conversion device.

As a comparison, a photoelectric conversion device was fabricated in the same manner except that a TiO$_2$ powder containing anatase type fine particles with about 20 nm particle diameter as a main component was used.

Light was radiated from a 500 W xenon lamp equipped with a ultraviolet-cutting filter to the side of the TiO$_2$ acicular crystal layer-bearing conductive glass of the respective devices and the values of the photoelectric current were measured. In the same manner, light was radiated to the side of the platinum layer-bearing conductive glass of the devices and the values of photoelectric current by photoelectric conversion reaction were measured. As a result, the open-circuit voltage and the fill factor of the device of the present invention were both higher by about 5% than those of the device of the comparison in the case of radiating light to the devices from the side of the conductive glass bearing the TiO$_2$ acicular crystal layer and both by about 7% in the case of radiating light to the devices from the side of the conductive layer bearing the platinum layer. The difference is supposedly attributed to the decrease of the internal resistance of the electron acceptor-type charge transfer layer owing to use of the acicular crystals.

Example 2

A device using a ZnO acicular crystal and a device using a SnO$_2$ acicular crystal instead of the TiO$_2$ acicular crystal were fabricated. The diameter of the ZnO acicular crystal used for the present invention was about 50 nm and the length was about 5 times as long as the diameter. The diameter of the SnO$_2$ acicular crystal used was about 300 nm and the length was about 10 times as long as the diameter. The same method of producing the device of Example 1 was applied for the respective production methods and the same evaluation method of Example 1 was carried out. As a result, the open-circuit voltage values and the fill factors of both devices were both higher by about 3% than those of the devices of comparison (a device using a ZnO powder and a device using a SnO$_2$ powder) in the case of radiating the light from the side of the conductive glass bearing the acicular crystal layer, and both of the open-circuit voltage values and the fill factors were higher by about 5% in the case of radiating the light from the side of the conductive glass bearing the platinum layer.

Example 3

A production example of a photoelectric conversion device comprising a semiconductor acicular crystal layer formed by oxidizing a metal material will be described with reference of FIGS. 5A to 5D in the present example.

A substrate was produced by forming a Ti undercoating electrode layer 42 of 3 μm thickness on a quartz substrate 41, and a Ti substrate (a metal substrate) 44 was produced, and the respective substrates were immersed in a 0.3 M oxalic acid and 40 V voltage was applied to slightly anodize the Ti surface. The resultant substrates were fired at 700° C. for 10 hours in He gas current containing 10 ppm of oxygen at 100 sccm flow speed. Rutile type TiO$_2$ acicular crystals were grown from the undercoating metal layer and the substrate on the Ti undercoating metal layer 42 and the Ti substrate 44 after firing as illustrated in FIGS. 5A and 5B. The diameter of the TiO$_2$ acicular crystals was 0.1 to 1 μm and the length was 10 to 100 times as long as the diameter.

The same coloring agent as that used for Example 1 was adsorbed in the surface of the acicular crystals in the same manner as that of Example 1, and a photoelectric conversion device was fabricated in the same manner as that of Example 1, except that a conductive glass (a glass plate on which a F-doped SnO$_2$ (sheet resistance 100 Ω/□) film was formed) bearing a graphite layer (about 1 nm thickness) was used instead of the conductive glass bearing the platinum layer.

As a comparison, a photoelectric conversion device was fabricated in the same manner using a TiO$_2$ powder containing anatase type fine particles with about a 20 nm particle diameter as a main component.

The photoelectric current value was measured in the same manner as that for Example 1. The light incidence was carried out from the side of the conductive glass bearing the graphite layer. As a result, the open-circuit voltage and the fill factor of the device of the present example were both higher by about 10% than those of the device of the comparison. The difference is supposedly attributed to the decrease of the internal resistance of the electron acceptor-type charge transfer layer owing to use of the acicular crystals.

Example 4

A production example of a photoelectric conversion device comprising semiconductor acicular crystals grown from nano holes by oxidizing a metal material will be described with reference to FIGS. 4A to 4D in the present example.

A substrate was produced by forming a Ti undercoating electrode layer 42 of 3 μm thickness on a quartz substrate 41, and a Ti substrate (a metal substrate) 44 was produced, and the Ti surfaces of the respective substrates were coated with Al layers with 0.5 μm thickness. Then, the respective substrates were immersed in a 0.3 M oxalic acid and 40 V voltage was applied to slightly anodize the Ti surfaces. After that, the respective substrates were immersed in 5 wt. % phosphoric acid for 40 minutes. By that treatment, nano hole layers 43 having a large number of nano holes with about 50 nm diameter at about 100 nm gaps were formed on the alumina layers formed by anodization. The resultant substrates were then fired at 700° C. for 10 hours in He gas current containing 10 ppm of oxygen at 100 sccm flow speed. Rutile type TiO$_2$ acicular crystals were grown in the Ti undercoating metal layer 42 and the Ti substrate 44 after firing as illustrated in FIGS. 5A and 5B. The diameter of the TiO$_2$ acicular crystals was 0.02 to 0.05 µm and the length was 20 to 500 times as long as the diameter.

The same coloring agent as that used for Example 3 was adsorbed in the surface of the acicular crystals in the same manner as that of Example 3, and a photoelectric conversion device was fabricated in the same manner as that of Example 3.

As a comparison, a photoelectric conversion device was fabricated in the same manner using a TiO$_2$ powder containing anatase type fine particles with about 20 nm particle diameter as a main component.

The photoelectric current value was measured in the same manner as for Example 1. The light incidence was carried out from the side of the conductive glass bearing the graphite layer. As a result, the open-circuit voltage and the fill factor of the device of the present example were both higher by about 15% than those of the device of the comparison. The difference is supposedly attributed to the decrease of the internal resistance of the electron acceptor-type charge transfer layer owing to use of the acicular crystals. Moreover, it is supposedly attributed to the high aspect ratio and the roughness factor improvement of the acicular crystals.

Example 5

A production example of a photoelectric conversion device comprising semiconductor acicular crystal layers grown using an open-to-atmosphere type CVD will be described with reference to FIGS. 5A to 5D and FIG. 7 in the present example.

Figure 7:
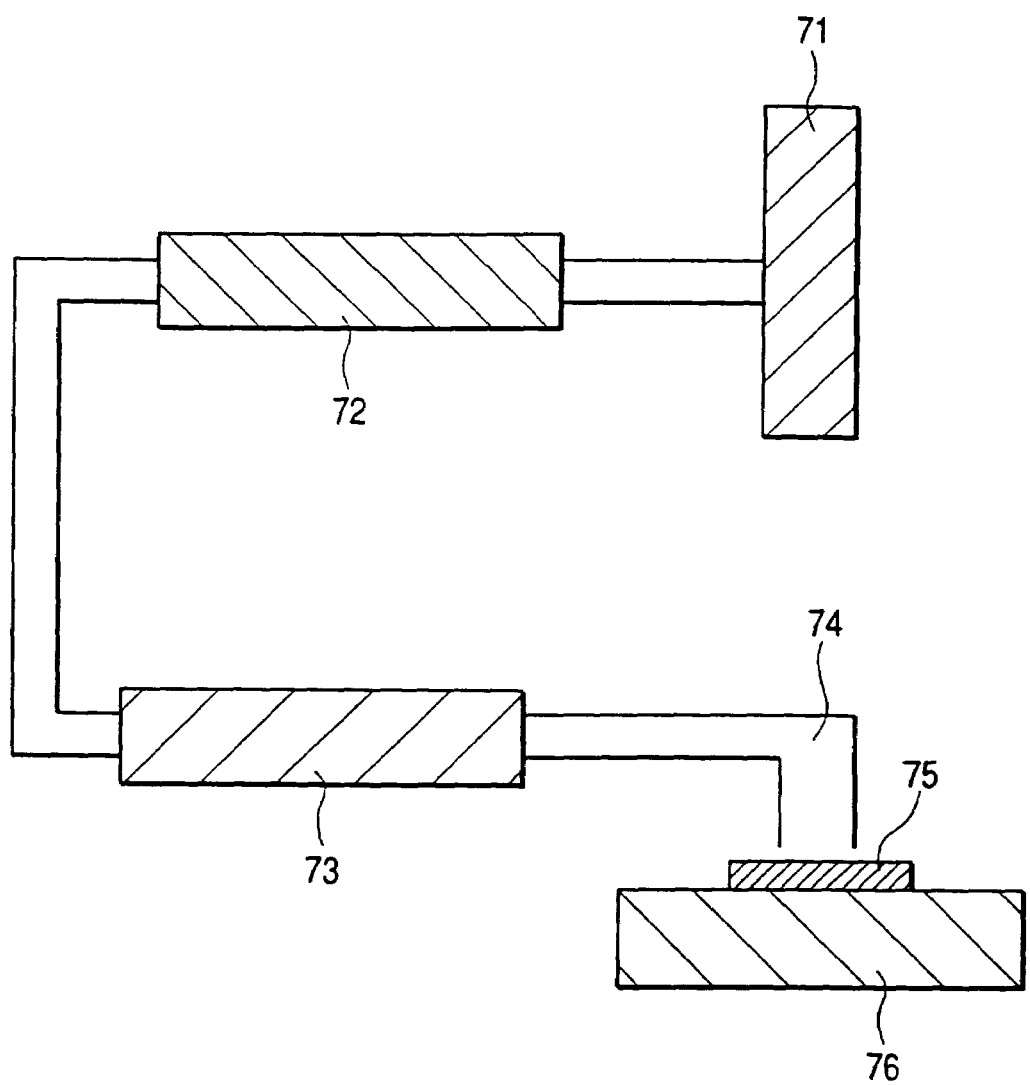
FIG. 7 is a simplified figure of an open-to-atmosphere type CVD apparatus.

FIG. 7 illustrates a simplified figure of an open-to-atmosphere type CD apparatus employed for the present example and in the figure, 71 denotes a nitrogen bomb, 72 a flow meter, 73 a raw material evaporator, 74 a nozzle, 75 an object substrate to be treated, and 76 a substrate heating stand.

A substrate was produced by forming an Al undercoating electrode layer 42 of 3 µm thickness on a quartz substrate 41, and an Al substrate (a metal substrate) 44 was produced, and the substrates 75 as object substrates to be treated were respectively set on the substrate heating stand 76 of the CVD apparatus. Then, bisacetylacetonatozinc (II) in solid phase was put in the raw material evaporator 73 and evaporated by heat at 115° C. While the flow rate was being controlled by the flow meter 72, nitrogen gas was supplied from the nitrogen bomb 71 to the apparatus and the evaporated bisacetylacetonatozinc (II) was sprayed to the substrates 75 from the nozzle 74. By such a treatment, ZnO acicular crystals were grown from the undercoating electrode layer and the substrate on the surface of Al undercoating electrode layer 42 and on the surface of the Al substrate 44 as illustrated in FIGS. 5A, 5B. The diameter of the ZnO acicular crystals was about 1 µm and the length was 10 to 100 times as long as the diameter.

The same coloring agent as that used for Example 3 was adsorbed in the surface of the acicular crystals in the same manner as that of Example 3, and a photoelectric conversion device was fabricated in the same manner as that of Example 3.

As a comparison, a photoelectric conversion device was fabricated in the same manner using a thermally treated ZnO powder with about a 1 µm particle diameter.

The photoelectric current value was measured in the same manner as that for Example 1. The light incidence was carried out from the side of the conductive glass bearing the graphite layer. As a result, the open-circuit voltage and the fill factor of the device of the present example were both higher by about 20% than those of the device of the comparison. The difference is supposedly attributed to the decrease of the internal resistance of the electron acceptor-type charge transfer layer owing to use of the acicular crystals. Moreover, it is supposedly attributed to the high aspect ratio and the roughness factor improvement of the acicular crystals.

Also, in the case where a ZnO layer and an Al layer were formed on Ti substrates to obtain the object substrates 75 to be treated and then alumina nano holes were formed in the same manner as that of Example 4, ZnO acicular crystals were found grown through the alumina nano holes from the ZnO layer and a photoelectric conversion device fabricated using the substrates had open-circuit voltage and fill factor both higher by about 20% than those of a device of comparison.

Example 6

A production example of a photoelectric conversion device comprising semiconductor acicular crystal layers grown using an open-to-atmosphere type CVD, as in Example 5, will be described with reference to FIGS. 5A to 5D and FIG. 7 in the present example.

As an object substrate 75 to be treated, a glass plate 41 on which a F-doped SnO$_2$ layer 42 (sheet resistance 10 Ω/□) was formed was employed, and ZnO acicular crystals were grown on the SnO$_2$ layer 42 in the same manner as that of Example 5. The diameter of the ZnO acicular crystals was about 1 µm and the length was 10 to 100 times as long as the diameter.

After that, a photoelectric conversion device was fabricated in the same manner as that of Example 5, except that CuI, which is a p-type semiconductor, was employed for the charge transfer layer 12. CuI was dissolved in anhydrous acetonitrile and deposited on the surface of a mesoscopic ZnO layer (an acicular crystal layer) bearing dye. The substrate 41 bearing the charge transfer layer 12 was overlaid on the conductive glass bearing the graphite layer to give a solid chemical solar cell (a photoelectric conversion device).

A photoelectric conversion device was fabricated using a thermally treated ZnO powder with about 1 µm particle diameter in the same manner for comparison.

The photoelectric current value was measured in the same manner as that for Example 1. The light incidence was carried out from the side of the conductive glass bearing the graphite layer. As a result, the open-circuit voltage and the fill factor of the device of the present example were both higher by about 20% than those of the device of the comparison. The difference is supposedly attributed to the decrease of the internal resistance of the electron acceptor-type charge transfer layer owing to use of the acicular crystals. Moreover, it is supposedly attributed to the high aspect ratio and the roughness factor improvement of the acicular crystals.

Example 7

A production example of a photoelectric conversion device comprising an electron acceptive charge transfer layer formed using a rutile type acicular crystal powder will be described in the present example.

A slurry was produced by mixing 3 g of rutile type TiO$_2$ acicular crystal having 200 to 300 nm diameter and the length about 10 times as long as the diameter and 3 g of anatase type TiO$_2$ micro crystal (P25) having about a 20 nm diameter with 10 mL (milliliter) of water, 0.2 mL of acetylacetone, and 0.2 mL of Triton X (registered trade name: produced by Union Carbide Corp.). The slurry was applied to a conductive glass (F-doped $SnO_2$, 100 Ω/□) in about 50 µm thickness and 1 cm² square using a spacer and then the resultant glass was fired at 450° C. for 1 hour in oxygen gas flow at 100 mL/min (sccm).

The thickness of the obtained $TiO_2$ acicular crystal layer after firing was about 10 µm. $Ru((bipy)_2(COOH)_2(SCN)_2)$, which was a Ru complex salt reported by Graetzel, was used as dye. The coloring agent was dissolved in distilled ethanol, and the $TiO_2$ electrode was immersed in the resultant solution for 120 minutes to adsorb the coloring agent to the electrode, and then the electrode was taken out of the solution and dried at 80° C. On the other hand, another conductive glass (F-doped $SnO_2$, 10 Ω/□) bearing a platinum layer of 1 nm thickness formed by sputtering was employed as a counterpart electrode and $I^-/I_3^-$ was used as a redox pair. A mixed solution employed for the present example contained 0.46 mol/L of tetrapropylammonium iodide and 0.06 mol/L of iodine as solutes and 80 vol. % of ethylene carbonate and 20 vol. % of acetonitrile as solvents. The solution was dropwise applied to the $TiO_2$-bearing conductive glass, and the mixed solution was held between the conductive glass bearing the $TiO_2$ and the counterpart electrode to obtain a cell.

As a comparison, a cell using only P25 was fabricated in the same manner.

Light was radiated from a 500 W xenon lamp equipped with a ultraviolet-cutting filter to the side of the conductive glass bearing $TiO_2$ or to the side of the counterpart electrode. The values of the photoelectric current generated at that time by the photoelectric conversion reaction were measured. As a result, the open-circuit voltage and the fill factor of the cell of the present invention were both higher by about 5% than those of the cell of the comparison and, especially in the case of radiating light to the cells from the counterpart electrodes, both were higher by about 7%. The difference is supposedly attributed to the decrease of the internal resistance of the electron acceptor-type charge transfer layer owing to use of the mixed crystal.

Example 8

Similar experiments to that of Example 7 were carried out using a ZnO acicular crystal and a $SnO_2$ acicular crystal, respectively, instead of the $TiO_2$ acicular crystal.

The ZnO acicular crystal used for the present invention had a tetrapod-like shape, a diameter of about 1 µm, and a length about 5 times as long as the diameter, and the $SnO_2$ acicular crystal used had a diameter of about 0.5 µm and a length about 10 times as long as the diameter. The same method of producing the device of Example 7 was applied for the respective production methods, and the same evaluation method as that of Example 1 was carried out. As a result, the open-circuit voltage values and the fill factors of both devices were both higher by about 3% than those of the devices of comparison (a device using a ZnO powder and a device using a $SnO_2$ powder) in the case of radiating the light from the side of the conductive glass bearing the mixed crystal, and both of the open-circuit voltage values and the fill factors were higher by 5% or more in the case of radiating the light from the side of the counterpart electrodes. That is supposedly attributed to the decrease of the internal resistance of the electron acceptor-type charge transfer layer owing to use of the mixed crystal.

Example 9

A production example of semiconductor acicular crystals by oxidizing a metal material will be described with reference to FIGS. 5A to 5D in the present example.

A substrate was produced by forming a Ti undercoating electrode layer 42 of 3 µm thickness on a quartz substrate 41 and a substrate of a Ti plate 44 was produced, and the respective Ti surfaces were slightly anodized at 40 V voltage in 0.3 mol/L oxalic acid. The resultant substrates were then fired at 700° C. for 10 hours in flow of He gas containing 10 ppm oxygen at 100 mL/min (sccm) flow rate. Rutile type $TiO_2$ acicular crystals were found on the Ti undercoating metal layer and the Ti substrate surface after firing, growing from the substrates as illustrated in FIGS. 5C and 5D. The diameter of the $TiO_2$ acicular crystals was 0.1 to 2 µm, and the length was 10 to 100 times as long as the diameter. The resultant substrates were then immersed in a slurry produced by mixing 3 g of anatase type $TiO_2$ micro crystal (P25) having about a 20 nm particle diameter with 40 mL of water, 0.2 mL of acetylacetone, and 0.2 mL of Triton X, and after that, the substrates were again fired at 450° C. for 1 hour in oxygen gas flow at 100 mL/min (sccm). Dye was adsorbed on the surface of the obtained acicular crystals in the same manner as that of Example 1. On the other hand, another conductive glass (F-doped $SnO_2$, 10 Ω/□) bearing graphite of about 1 nm thickness was employed as a counterpart electrode, and $I^-/I_3^-$ was used as a redox pair. Same as in the solution employed for Example 7, a mixed solution employed for the present example contained tetrapropylammonium iodide (0.46 mol/L) and iodine (0.06 mol/L) as solutes and ethylene carbonate (80 vol. %) and acetonitrile (20 vol. %) as solvents. The solution was dropwise applied to the $TiO_2$-bearing conductive glass, and the mixed solution was held between the conductive glass bearing the $TiO_2$ and the counterpart electrode to obtain a cell.

As a comparison, a cell using only P25 was fabricated in the same manner.

In the same manner as that of Example 7, light was radiated from a 500 W xenon lamp equipped with a ultraviolet-cutting filter from the side of the counterpart electrode. The values of the photoelectric current generated at that time by the photoelectric conversion reaction were measured. As a result, the open-circuit voltage and the fill factor of the cell of the present invention were both higher by about 10%. That is supposedly attributed to the decrease of the internal resistance of the electron acceptor-type charge transfer layer owing to use of the acicular crystal.

Example 10

A production example of semiconductor acicular crystals from nano holes by oxidizing a metal material will be described with reference to FIGS. 4A to 4D in the present example.

Figure 4A:
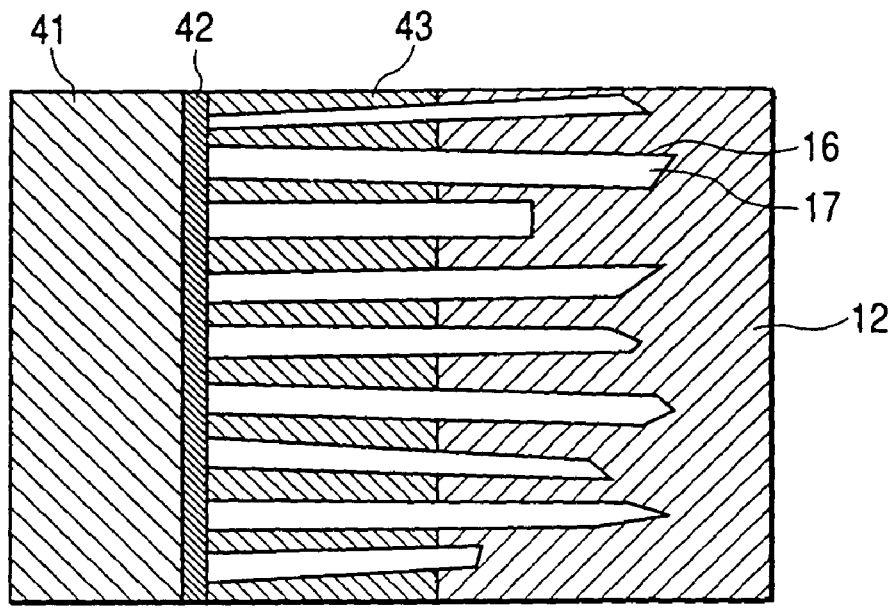
FIGS. 4A, 4B, 4C and 4D are cross-sectional views illustrating the mixed crystals from the nanny-holes of the present invention.
Figure 4B:
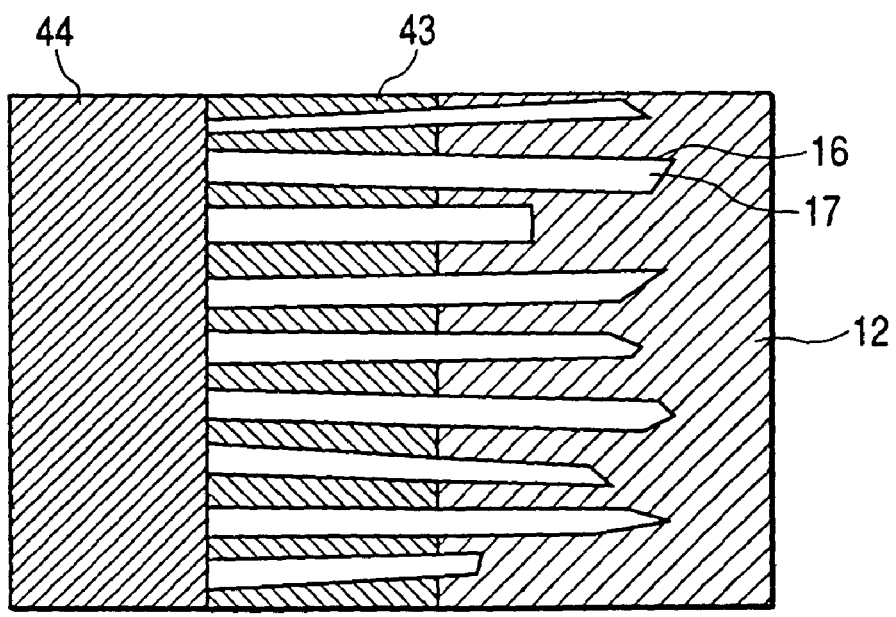
Figure 4C:
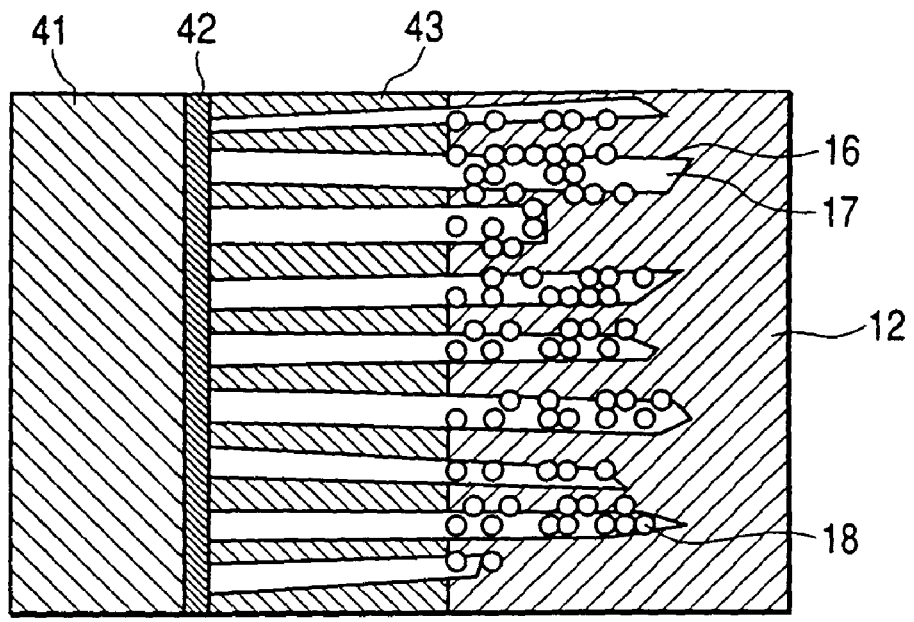
Figure 4D:
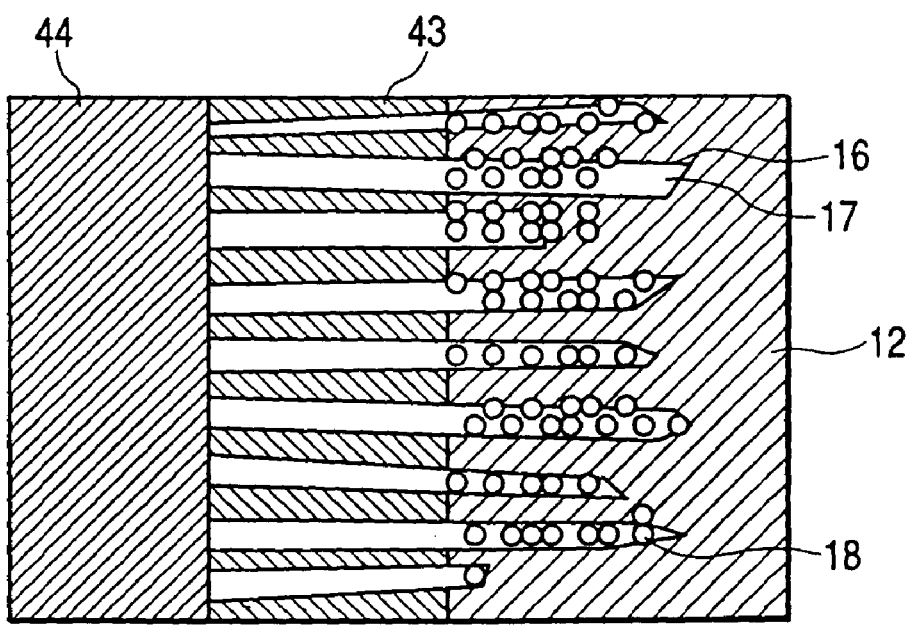

A substrate was produced by forming a Ti undercoating electrode layer 42 of 3 µm thickness on a quartz substrate 41, and a substrate of a Ti plate 44 was produced, and the respective Ti surfaces were coated with 0.5 µm thick Al films. The Al films were anodized at 40 V voltage in 0.3 mol/L oxalic acid and then immersed in 5 wt. % phosphoric acid for 40 minutes. By the treatment, a large number of nano holes with about 50 nm diameter at about 100 nm gaps were formed in the alumina layers 43 formed by anodization. The resultant substrates were then fired at 700° C. for 10 hours in He gas current containing 10 ppm of oxygen at 1100 mL/min (sccm) flow speed. Rutile type $TiO_2$ acicular crystals 17 were found in the Ti undercoating metal layer and the Ti substrate surface after firing as illustrated in FIGS. 4C and 4D, growing from the nano holes of the electrodes. The diameter of the $TiO_2$ acicular crystals was 0.02 to 0.05 μm and the length was 20 to 500 times as long as the diameter. The resultant substrates were then immersed in a slurry produced by mixing 3 g of anatase type $TiO_2$ micro crystal (P25) having about a 20 nm particle diameter with 40 mL of water, 0.2 mL of acetylacetone, and 0.2 mL of Triton X, and after that, the substrates were again fired at 450° C. for 1 hour in oxygen gas flow at 100 mL/min (sccm).

Further, dye was adsorbed on the surface of the obtained acicular crystals in the same manner as that of Example 7. On the other hand, conductive glass (F-doped $SnO_2$, 10 Ω/□) bearing graphite of about 1 nm thickness was employed as a counterpart electrode and $I^-/I_3^-$ was used as a redox pair. Same as in Example 1, a mixed solution containing tetrapropylammonium iodide (0.46 mol/L) and iodine (0.06 mol/L) as solutes and ethylene carbonate (80 vol. %) and acetonitrile (20 vol. %) as solvents was employed. The solution was dropwise applied to the $TiO_2$-bearing conductive glass and the mixed solution was held between the conductive glass bearing the $TiO_2$ and the counterpart electrode to obtain a cell.

As a comparison, a cell using only P25 was fabricated in the same manner.

In the same manner as that of Example 7, light was radiated from a 500 W xenon lamp equipped with a ultra-violet-cutting filter from the side of the counterpart electrode. The values of the photoelectric current generated at that time by the photoelectric conversion reaction were measured. As a result, the open-circuit voltage and the fill factor of the cell of the present invention were both higher by about 5%. That is supposedly attributed to the decrease of the internal resistance of the electron acceptor-type charge transfer layer owing to use of the acicular crystals.

Example 11

A production example of semiconductor acicular crystals using an open-to-atmosphere type CVD method will be described with reference to FIGS. 5A to 5D and FIG. 7 in the present example.

A substrate was produced by forming an Al undercoating electrode layer 42 of 3 μm thickness on a quartz substrate 41, and an Al substrate 44 was produced. These substrates were respectively set on the substrate heating stand 76 of the CVD apparatus. Then, bisacetylacetonatozinc (II) in solid phase was put in a raw material evaporator 73 and evaporated by heat at 115° C. While being carried with nitrogen, the evaporated bisacetylacetonatozinc (II) was sprayed to the Al substrates 75 from a nozzle 74. After the treatment, ZnO acicular crystals were found grown on the Al undercoating electrode layer and the Al substrate surface as illustrated in FIGS. 5A, 5B. The diameter of the ZnO acicular crystals was about 1 μm and the length was 10 to 100 times as long as the diameter. The resultant substrates were then immersed in a slurry-like solution produced by mixing 3 g of rutile type $TiO_2$ acicular crystal and 3 g of anatase type $TiO_2$ micro crystal (P25) having about a 20 nm diameter with 40 mL of water, 0.2 mL of acetylacetone, and 0.2 mL of Triton X, and after that, the substrates were fired at 450° C. for 1 hour in oxygen gas flow at 100 mL/min (sccm). Then, dye was adsorbed on the surface of the acicular crystals in the same manner as that of Example 1. On the other hand, conductive glass (F-doped $SnO_2$, 10 Ω/□) bearing graphite of 1 nm thickness was employed as a counterpart electrode and $I^-/I_3^-$ was used as a redox pair. Same as in Example 7, a mixed solution containing tetrapropylammonium iodide (0.46 mol/L) and iodine (0.06 mol/L) as solutes and ethylene carbonate (80 vol. %) and acetonitrile (20 vol. %) as solvents was employed. The solution was dropwise applied to the ZnO-bearing conductive substrate and the mixed solution was held between the conductive substrate bearing the ZnO and the counterpart electrode to obtain a cell.

As a comparison, a cell using a thermally treated ZnO powder mainly containing particles of about 1 μm particle diameter was fabricated in the same manner.

In the same manner as that of Example 7, light was radiated from a 500 W xenon lamp equipped with a ultra-violet-cutting filter from the counterpart electrode side. The values of the photoelectric current generated at that time by the photoelectric conversion reaction were measured. As a result, the open-circuit voltage and the fill factor of the cell of the present invention were both higher by about 7%. That is supposedly attributed to the decrease of the internal resistance of the electron acceptor-type charge transfer layer owing to use of the acicular crystals.

Example 12

A production example of semiconductor acicular crystals using an open-to-atmosphere type CVD method will be described with reference to FIGS. 5A to 5D and FIG. 7 in the present example.

Conductive glass (F-doped $SnO_2$, 10 Ω/□) was produced by forming a F-doped $SnO_2$ 42 film on a substrate glass 44 and the substrate was set on a substrate heating stand 76 of the CVD apparatus. Then, bisacetylacetonatozinc (II) in solid phase was put in a raw material evaporator 73 and evaporated by heat at 115° C. While being carried with nitrogen, the evaporated bisacetylacetonatozinc (II) was sprayed to the conductive glass substrate 75 from a nozzle 74. After the treatment, ZnO acicular crystals were found grown on the conductive glass surface as illustrated in FIG. 5C. The diameter of the ZnO acicular crystals was about 1 μm, and the length was 10 to 100 times as long as the diameter. The resultant substrate was then immersed in a slurry-like solution produced by mixing 3 g of rutile type $TiO_2$ acicular crystal and 3 g of anatase type $TiO_2$ micro crystal (P25) having about a 20 nm diameter with 40 mL of water, 0.2 mL of acetylacetone, and 0.2 mL of Triton X and after that the substrate was fired at 450° C. for 1 hour in oxygen gas flow at 100 mL/min (sccm). Then, dye was adsorbed on the surface of the acicular crystals in the same manner as that of Example 1. On the other hand, conductive glass (F-doped $SnO_2$, 10 Ω/□) bearing graphite of about 1 nm thickness was employed as a counterpart electrode and CuI was used as a p-type semiconductor. CuI was at first dissolved in anhydrous acetonitrile and then deposited on the interfaces of the mesoscopic ZnO film bearing the coloring agent. The solid electrode produced in such a manner and the counterpart electrode were overlaid onto each other to obtain a solid chemical solar cell.

As a comparison, a cell using a thermally treated ZnO powder mainly containing particles of about 1 μm particle diameter was fabricated in the same manner.

In the same manner as that of Example 7, light was radiated from a 500 W xenon lamp equipped with a ultra-violet-cutting filter from the counterpart electrode side. The values of the photoelectric current generated at that time by the photoelectric conversion reaction were measured. As a result, the open-circuit voltage and the fill factor of the cell of the present invention were both higher by about 7%. That is supposedly attributed to the decrease of the internal resistance of the electron acceptor-type charge transfer layer owing to use of the acicular crystals.

Example 13

A production example of a photoelectric conversion device using a rutile type acicular crystal powder for an electron acceptive charge transfer layer will be described in the present example.

A slurry was produced by mixing 6 g of rutile type $TiO_2$ acicular crystal having 200 to 300 nm diameter and a length about 10 times as long as the diameter with 10 mL (milliliter) of water, 0.2 mL of acetylacetone, and 0.2 mL of Triton X. The slurry was applied to a conductive glass (F-doped $SnO_2$, 100 Ω/□) in about 50 μm thickness and 1 cm² square using a spacer, and then the resultant glass was fired at 450° C. for 1 hour in oxygen gas flow at 100 mL/min (sccm). The resultant substrate was then immersed in a slurry-like solution produced by mixing 3 g of anatase type $TiO_2$ micro crystal (P25) having about a 20 nm diameter with 40 mL of water, 0.2 mL of acetylacetone, and 0.2 mL of Triton X and, after that, the substrate was fired at 450° C. for 1 hour in oxygen gas flow at 100 mL/min (sccm). Then, dye was adsorbed on the surface of the acicular crystals in the same manner as that of Example 7. Then, conductive glass (F-doped $SnO_2$, 10 Ω/□) bearing graphite of about 1 nm thickness was employed as a counterpart electrode, and $I^-/I_3^-$ was used as a redox pair. Same as in Example 7, a mixed solution containing tetrapropylammonium iodide (0.46 mol/L) and iodine (0.06 mol/L) as solutes and ethylene carbonate (80 vol. %) and acetonitrile (20 vol. %) as solvents was employed. The solution was dropwise applied to the $TiO_2$-bearing conductive substrate and the mixed solution was held between the conductive substrate bearing the $TiO_2$ and the counterpart electrode to obtain a cell.

As a comparison, a cell using only P25 was fabricated in the same manner.

Light was radiated from a 500 W xenon lamp equipped with a ultraviolet-cutting filter from the side of the conductive substrate bearing the $TiO_2$ and to the side of the counterpart electrode. The values of the photoelectric current generated at that time by the photoelectric conversion reaction were measured. As a result, the open-circuit voltage and the fill factor of the cell of the present invention were both higher by about 3% and especially, higher by about 5% in the case where light was radiated to the counterpart electrode side. That is supposedly attributed to the decrease of the internal resistance of the electron acceptor-type charge transfer layer owing to use of the acicular crystals.

As described above, the present invention can provide a photoelectric conversion device in which the transfer and the movement of electrons and holes are smoothly carried out, internal resistance and recombination probability is low, and a high conversion efficiency can be achieved.

Also, the present invention can provide a photoelectric conversion device comprising a semiconductor electrode provided with a light absorption layer of dye and a charge transfer layer of an electrolytic solution with high impregnation and movement speed.

Further, the present invention can provide a photoelectric conversion device with high open-circuit voltage.

Moreover, the present invention can provide a method of producing photoelectric conversion devices provided with the foregoing characteristics.

What is claimed is:

1. A photoelectric conversion device comprising:
a light absorption region for photoelectric conversion;
a first charge transfer region for accepting electrons from the light absorption region;
a second charge transfer region for donating electrons to the light absorption region; and
two electrode regions between which the first and second charge transfer regions and the light absorption region are positioned,
wherein the light absorption region is positioned between the charge transfer regions,
wherein the light absorption region is a semiconductor, and either of the first and second charge transfer regions is a semiconductor acicular crystal region comprising an aggregate of acicular crystals, and
wherein the acicular crystals comprise a metal oxide.

2. A photoelectric conversion device according to claim 1, wherein the metal oxide is titanium oxide, zinc oxide or tin oxide.

3. A photoelectric conversion device according to claim 1, wherein an aspect ratio of the acicular crystals is 5 or more when the aspect ratio is defined as the ratio of the length of the acicular crystals to the diameter of the acicular crystals or as the ratio of the length of the acicular crystals to the length of the shortest line in a transverse cross-section of the acicular crystals passing the gravity center of the acicular crystals.

4. A photoelectric conversion device according to claim 1, wherein the light absorption region comprises an amorphous semiconductor or a direct transition semiconductor.

5. A photoelectric conversion device according to claim 1, wherein the acicular crystals bear particles.

6. A photoelectric conversion device according to claim 1, wherein the acicular crystals are joined to a surface of a substrate and the angle between the axial direction of the acicular crystals and the surface of the substrate is 60 degrees or more.

7. A photoelectric conversion device comprising:
a light absorption region for photoelectric conversion;
a first charge transfer region for accepting electrons from the light absorption region;
a second charge transfer region for donating electrons to the light absorption region; and
two electrode regions between which the charge transfer regions and the light absorption region are positioned,
wherein the light absorption region is positioned between the first and second charge transfer regions,
wherein the light absorption region is a semiconductor, and either of the fist and second charge transfer regions is a semiconductor acicular crystal region comprising an aggregate of acicular crystals, and
wherein the acicular crystals comprise CuI or NiO.

8. A photoelectric conversion device comprising:
a light absorption region for photoelectric conversion;
a first charge transfer region for accepting electrons from the light absorption region;
a second charge transfer region for donating electrons to the light absorption region; and
two electrode regions between which the charge transfer regions and the light absorption region are positioned,
wherein the light absorption region is positioned between the first and second charge transfer regions,
wherein the light absorption region is a semiconductor, and either of the first and second charge transfer regions is a semiconductor acicular crystal region comprising an aggregate of acicular crystals, and
wherein an aspect ratio of the acicular crystals is 10 or more when the aspect ratio is defined as the ratio of the length of the acicular crystals to the diameter of the acicular crystals or as the ratio of the length of the acicular crystals to the length of the shortest line in a transverse cross-section of the acicular crystals passing the gravity center of the acicular crystals.

* * * * *

UNITED STATES PATENT AND TRADEMARK OFFICE
CERTIFICATE OF CORRECTION

PATENT NO. : 7,087,831 B2
APPLICATION NO. : 10/663752
DATED : August 8, 2006
INVENTOR(S) : Tohru Den et al.

It is certified that error appears in the above-identified patent and that said Letters Patent is hereby corrected as shown below:

COVER PAGE:
(56) References Cited OTHER PUBLICATIONS
After "M.K. Nazeeruddin, et al.,": "(X↑Cl$^-$; Br$^-$; I$^-$; CN$^-$; and SCN$^-$)" should read -- (X = Cl$^-$, Br$^-$, I$^-$, CN$^-$, and SCN$^-$) --.

(56) References Cited OTHER PUBLICATIONS, page two
After "H. Tsubomura, et al.,": ""Dy" should read -- "Dye --;
After "Routkevitc et al.,": "Devic" should read -- Device --;
After "Masuda, et al.,": "Bi4Ti3O12" should read -- Bi$_4$Ti$_3$O$_{12}$ --;
After "Huber, et al.,": "Camposites,"" should read -- Composites," --; and
After "O'Regan, et al.,": "TiO2" should read -- TiO$_2$ --.

COLUMN 2:
Line 60, "being" should read -- are being --.

COLUMN 5:
Line 49, "crystal;" should read -- crystal. --.

COLUMN 8:
Line 54, "absoptance" should read -- absorptance --; and
Line 63, "shapes. Such" should read -- shapes, such --.

COLUMN 14:
Line 6, "reference of" should read -- reference to --.

COLUMN 18:
Line 67, "1100 mL/min" should read -- 100 mL/min --.

UNITED STATES PATENT AND TRADEMARK OFFICE
CERTIFICATE OF CORRECTION

PATENT NO. : 7,087,831 B2
APPLICATION NO. : 10/663752
DATED : August 8, 2006
INVENTOR(S) : Tohru Den et al.

It is certified that error appears in the above-identified patent and that said Letters Patent is hereby corrected as shown below:

COLUMN 22:
Line 42, "fist" should read -- first --.

Signed and Sealed this

Sixth Day of March, 2007

JON W. DUDAS
*Director of the United States Patent and Trademark Office*